US008426742B2

(12) United States Patent
Ejiri et al.

(10) Patent No.: US 8,426,742 B2
(45) Date of Patent: Apr. 23, 2013

(54) CONNECTING TERMINAL, SEMICONDUCTOR PACKAGE USING CONNECTING TERMINAL AND METHOD FOR MANUFACTURING SEMICONDUCTOR PACKAGE

(75) Inventors: Yoshinori Ejiri, Ibaraki (JP); Shuichi Hatakeyama, Tochigi (JP); Shigeharu Arike, Tochigi (JP); Kiyoshi Hasegawa, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 481 days.

(21) Appl. No.: 12/597,835

(22) PCT Filed: Apr. 23, 2008

(86) PCT No.: PCT/JP2008/057859
§ 371 (c)(1),
(2), (4) Date: Oct. 27, 2009

(87) PCT Pub. No.: WO2008/136327
PCT Pub. Date: Nov. 13, 2008

(65) Prior Publication Data
US 2010/0071940 A1    Mar. 25, 2010

(30) Foreign Application Priority Data

Apr. 27, 2007  (JP) .............................. P2007-118732
Apr. 3, 2008   (JP) .............................. P2008-097381

(51) Int. Cl.
*H01L 23/498*    (2006.01)
*H01L 21/60*     (2006.01)
*H01B 1/02*      (2006.01)

(52) U.S. Cl.
USPC ........ 174/257; 174/126.2; 174/255; 174/260; 438/106; 257/E21.506

(58) Field of Classification Search .......... 174/250–260, 174/263, 126.1, 126.2; 438/106, 575, 678; 257/E21.506, 769, 690, 734, 750
See application file for complete search history.

(56) References Cited

U.S. PATENT DOCUMENTS 6,518,508 B2 *  2/2003  Park et al. ............... 174/255
7,179,738 B2 *  2/2007  Abbott ..................... 438/654

(Continued)

FOREIGN PATENT DOCUMENTS

JP    05-343834    12/1993
JP    9-8438       1/1997

(Continued)

OTHER PUBLICATIONS

Oda, Yukinori, "Solder Joint Reliability of Lead Free Material for Electroless Nickel/Palladium/Gold Film," Journal of the Surface Finishing Society of Japan, vol. 58, No. 2, 2007, pp. 109-112.

(Continued)

*Primary Examiner* — Angel R Estrada
*Assistant Examiner* — Dimary Lopez
(74) *Attorney, Agent, or Firm* — Griffin & Szipl, P.C.

(57) ABSTRACT

The connection reliability of connecting terminals with displacement gold plating films is improved by connecting terminals comprising a conductive layer, an electroless nickel plating film, a first palladium plating film which is a displacement or electroless palladium plating film with a purity of 99% by mass or greater, a second palladium plating film which is an electroless palladium plating film with a purity of at least 90% by mass and less than 99% by mass, and a displacement gold plating film, wherein the electroless nickel plating film, the first palladium plating film, the second palladium plating film and the displacement gold plating film are laminated in that order on one side of the conductive layer, and the displacement gold plating film is situated on the uppermost surface layer on the opposite side from the conductive layer.

16 Claims, 9 Drawing Sheets

U.S. PATENT DOCUMENTS

| | | | |
|---|---|---|---|
| 7,820,913 B2 * | 10/2010 | Uno et al. | 174/94 R |
| 2003/0151141 A1 * | 8/2003 | Matsuki et al. | 257/746 |
| 2005/0001316 A1 * | 1/2005 | Dean et al. | 257/750 |

FOREIGN PATENT DOCUMENTS

| | | | |
|---|---|---|---|
| JP | 10-130856 | | 5/1998 |
| JP | 10-242205 A | | 9/1998 |
| JP | 2000-208555 | | 7/2000 |
| JP | 2000-277897 | | 10/2000 |
| JP | 2000277897 A | * | 10/2000 |
| JP | 2003-183840 | | 7/2003 |
| JP | 2003-297973 A | | 10/2003 |
| JP | 3596335 | | 12/2004 |
| JP | 2005-197442 | | 7/2005 |
| JP | 2005-317729 A | | 11/2005 |
| JP | 2006-196648 A | | 7/2006 |
| JP | 2006-339609 | | 12/2006 |

OTHER PUBLICATIONS

International Search Report issued in corresponding application No. PCT/JP2008/057859, completed Jul. 15, 2008 and mailed Jul. 29, 2008.

Notice of Allowance issued Jan. 25, 2011 in a counterpart Taiwanese application 097115059.

* cited by examiner

Fig.1
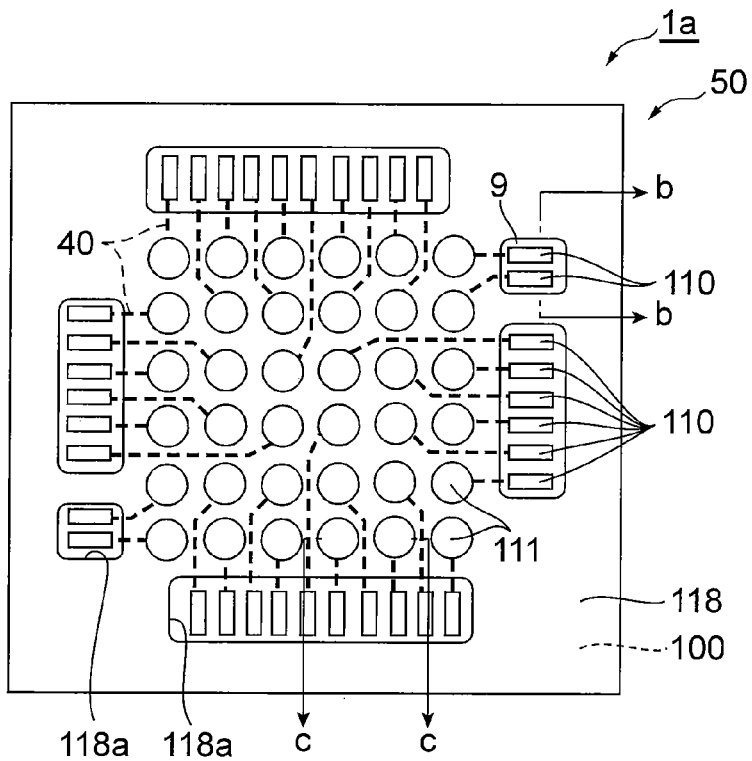
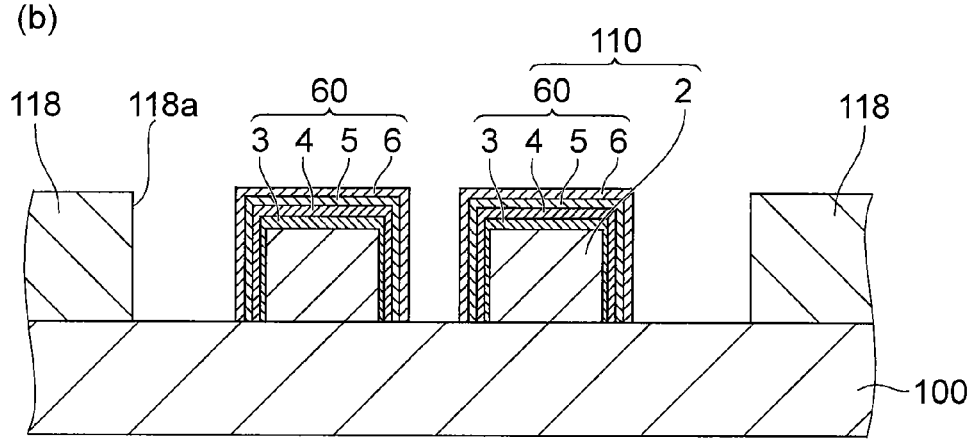
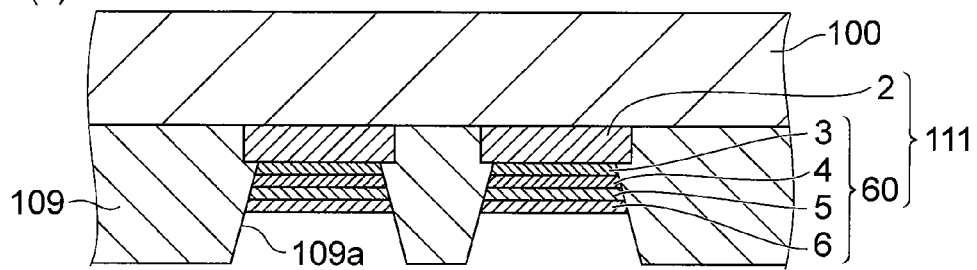

Fig.9
(a)
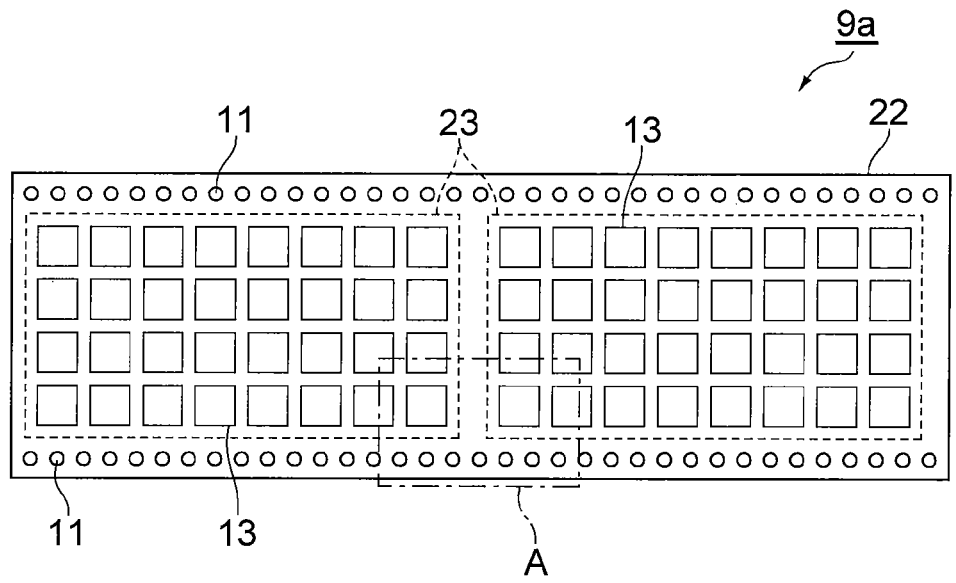
(b)
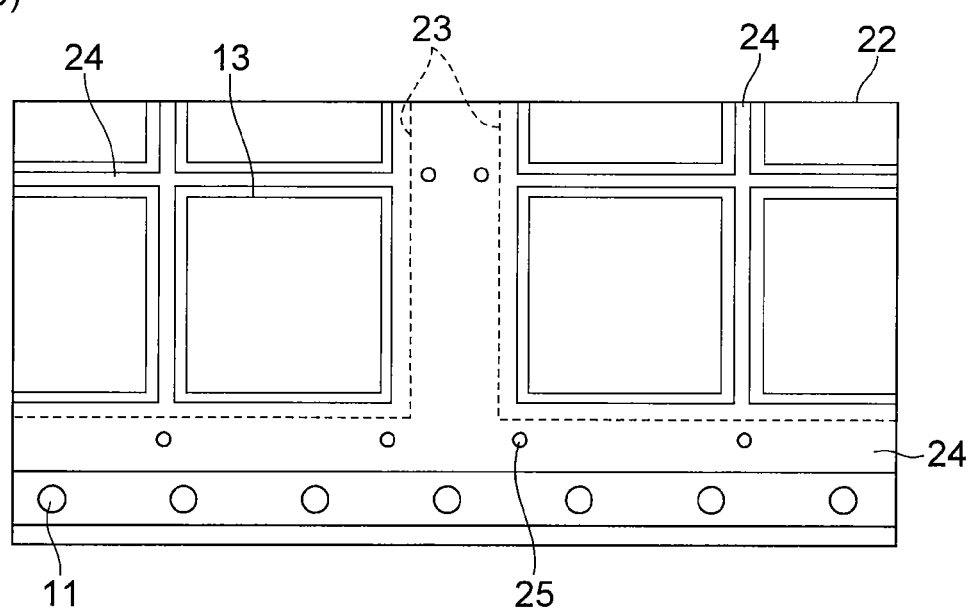

CONNECTING TERMINAL, SEMICONDUCTOR PACKAGE USING CONNECTING TERMINAL AND METHOD FOR MANUFACTURING SEMICONDUCTOR PACKAGE

This is a National Phase Application in the United States of International Patent Application No. PCT/JP2008/057859 filed Apr. 23, 2008, which claims priority on Japanese Patent Application Nos. P2007-118732, filed Apr. 27, 2007 and P2008-097381, filed Apr. 3, 2008. The entire disclosures of the above patent applications are hereby incorporated by reference.

TECHNICAL FIELD

The present invention relates to a connecting terminal, a semiconductor package using a connecting terminal, and a method for manufacturing a semiconductor package.

BACKGROUND ART

In recent years, advancements have continued to be made in size and weight reduction, high performance and high functionality of devices such as personal computers, cellular phones, wireless base stations, optical communication devices, servers and routers, of various sizes. Development of high-density mounting techniques for System-on-Chips (SoC) and System-in-Packages (SiP) is also progressing with increasing LSI speeds and functionality for CPU, DSP and memory devices.

Build-up system-type multilayer circuit boards are therefore being employed on semiconductor chip mounting boards and motherboards. With advancements in mounting technologies such as multi-pin and narrow-pitch formation on packages, printed circuit boards have been shifting from QFP (Quad Flat Package) to BGA (Ball Grid Array)/CSP (Chip Size Package) mounting.

Connection between semiconductor chip mounting boards and semiconductor chips is accomplished using gold wire bonding, for example. Semiconductor packages comprising connected semiconductor chip mounting boards and semiconductor chips are also connected with circuit boards (motherboards) by solder balls. Semiconductor chip mounting boards usually have connecting terminals for connection with semiconductor chips or circuit boards. Most connecting terminals are gold plated to ensure satisfactory metal bonding with gold wire or solder.

Electrolytic gold plating has been widely employed in the prior art as a method of gold plating connecting terminals. However, with the increasing high density of wirings due to smaller semiconductor packages, it is becoming difficult to secure the wirings for forming electrolytic gold plating on connecting terminal surfaces. Electroless gold plating processes, which do not require special wiring, have begun to receive attention, and Patent document 1, for example, proposes a process in which a copper circuit is plated by electroless nickel plating and then electroless gold plating. The term "electroless gold plating" referred to here means "displacement plating alone" or "displacement plating and electroless plating (reduction plating with a reducing agent in the plating solution).

Patent document 2, on the other hand, examines formation of an electroless nickel plating film, electroless palladium plating film, displacement gold plating film and electroless gold plating film in that order on the surface of copper in the shape of a terminal, because the wire bonding strength between the metal terminal and gold wire is reduced when a displacement or electroless gold plating film is formed after formation of an electroless nickel plating film, due to the heat treatment that follows plating. In Non-patent document 1, there is reported formation of an electroless palladium plating film as a phosphorus-containing electroless palladium-phosphorus alloy plating film using an electroless palladium plating solution with hypophosphorous acid or phosphorous acid as the reducing agent, to obtain a plating film formed by electroless nickel plating, electroless palladium-phosphorus plating and gold plating.

[Patent document 1] Japanese Patent Application Laid-Open HEI No. 5-343834

[Patent document 2] Japanese Patent Publication No. 3596335

[Non-patent document 1] Hyoumen Gijutsu [Surface Techniques]; 58, 35 (2007)

DISCLOSURE OF THE INVENTION

Problems to be Solved by the Invention

When a displacement gold plating film is formed after forming an electroless nickel plating film, the electroless nickel plating film is easily corroded by the displacement gold plating solution. When the electroless nickel plating film undergoes corrosion, the bond strength between the connecting terminal and gold wire is reduced, making it difficult to obtain sufficient connection reliability. Corrosion of the electroless nickel plating film can be inhibited by formation of a displacement palladium plating film or electroless palladium-phosphorus alloy plating film between the electroless nickel plating film and displacement gold plating film.

However, the present inventors have made the following discovery, based on assiduous research. Specifically, when an electroless palladium-phosphorus alloy plating film is formed on the surface of an electroless nickel plating film, using an electroless palladium plating solution with hypophosphorous acid or phosphorous acid as the reducing agent may interfere with deposition of palladium or phosphorus, making it difficult to form a homogeneous electroless palladium-phosphorus alloy plating film. More particularly, when an electroless palladium-phosphorus alloy plating film is formed all at once on a plurality of independent terminals, deposition does not occur to a uniform thickness on all of the terminals, but rather there is a tendency to result in terminals with no electroless palladium-phosphorus alloy plating film and terminals with thin film thicknesses. This phenomenon becomes more prominent with smaller terminal areas. As a result, since the palladium-phosphorus alloy plating film can no longer function as a protective layer for the electroless nickel plating film, the bond strength between the connecting terminals and gold wires is reduced.

Thus, it has been extremely difficult in practice to obtain sufficient connection reliability using connecting terminals with displacement or electroless gold plating films.

It is therefore an object of the present invention to improve the connection reliability of connecting terminals with displacement gold plating films.

Means for Solving the Problems

The connecting terminal of the invention comprises a conductive layer, an electroless nickel plating film, a first palladium plating film which is a displacement or electroless palladium plating film with a purity of 99% by mass or greater, a second palladium plating film which is an electroless palladium plating film with a purity of at least 90% by mass and less than 99% by mass, and a displacement gold plating film, wherein the electroless nickel plating film, the first palladium plating film, the second palladium plating film and the displacement gold plating film are laminated in that order on one side of the conductive layer, and the displacement gold plating film is situated on the uppermost surface layer on the opposite side from the conductive layer.

The first palladium plating film with a purity of 99% by mass or greater may be evenly deposited on the conductive layer using a plating solution with high activity. Also, if the first palladium plating film is present as a ground layer, a plating solution with relatively low activity, containing hypophosphorous acid or phosphorous acid as a reducing agent, for example, may be used to form a second palladium plating film with a purity of at least 90% by mass and less than 99% by mass at once, uniformly, on a plurality of terminals. By forming a palladium plating film to a uniform thickness in this manner, corrosion of the electroless nickel plating film caused by immersion in the displacement gold plating solution can be prevented. As a result, the connection reliability of the connecting terminals with displacement gold plating films can be improved.

If an electroless gold plating film is further laminated on the displacement gold plating film, it will be possible to obtain an even more notable effect for improvement of the connection reliability. However, if the sum of the thicknesses of the displacement gold plating film and the electroless gold plating film is less than 0.005 μm, the solder connection reliability will tend to be lower, and therefore the sum of the thicknesses of the displacement gold plating film and electroless gold plating film is preferably at least 0.005 μm.

When an electroless gold plating film is not laminated on the displacement gold plating film, the film thickness of the displacement gold plating film alone is preferably at least 0.005 μm.

The connecting terminals are preferably connecting terminals for solder connection.

A connecting terminal according to the invention can exhibit sufficient bond strength with solder. The connecting terminal of the invention is therefore particularly useful as a solder connecting terminal.

The connecting terminal is also preferably a wire bonding connecting terminal.

If the connecting terminal of the invention further comprises an electroless gold plating film laminated on the displacement gold plating film, and the electroless gold plating film is situated on the uppermost surface layer on the opposite side from the conductive layer, it will be possible to obtain sufficient bond strength not only with solder but also with wires such as gold wires, making it useful as a solder connecting terminal or wire bonding connecting terminal.

The second palladium plating film is preferably a palladium-phosphorus plating film.

The palladium-phosphorus plating film may be formed from a general purpose plating solution with low activity, containing a phosphorus-containing compound such as hypophosphorous acid or phosphorous acid as the reducing agent. If a palladium plating film with a purity of 99% by mass or greater is formed as the ground layer for the second palladium plating film, it will be possible to evenly form a palladium-phosphorus plating film.

Preferably, the film thickness of the first palladium plating film is not greater than 0.4 μm, the film thickness of the second palladium plating film is 0.03 to 0.3 μm, and the sum of the film thicknesses of the first palladium plating film and second palladium plating film is 0.03 to 0.5 μm.

If the film thickness of the first palladium plating film is greater than 0.4 μm, no further increase will be obtained in the bond strength between the connecting terminals and gold wire or solder, while formation of a thick film is also economically disadvantageous. If the film thickness of the second palladium plating film is at least 0.03 μm it will be possible to obtain a more satisfactory improving effect on the wire bonding properties and connection reliability with solder. However, if the film thickness of the second palladium plating film is greater than 0.3 μm, no further increase will be obtained in the bond strength between the connecting terminals and gold wire or solder, while formation of a thick film is also economically disadvantageous. If the sum of the film thicknesses of the first palladium plating film and second palladium plating film is at least 0.03 μm, it will be possible to obtain a more satisfactory improving effect on the connection reliability.

The purity of the electroless nickel plating film is preferably at least 80% by mass. The film thickness of the electroless nickel plating film is preferably 0.1 to 20 μm.

If the purity of the electroless nickel plating film is lower than 80% by mass, the improving effect on the connection reliability will tend to be reduced. The improving effect on the connection reliability will also tend to be reduced if the film thickness of the electroless nickel plating film is smaller than 0.1 μm. It will be difficult to obtain any further improvement in the connection reliability if the film thickness of the electroless nickel plating film is greater than 20 μm, and such a thickness is also economically disadvantageous.

The conductive layer preferably contains at least one metal selected from the group consisting of copper, tungsten, molybdenum and aluminum.

The semiconductor package of the invention comprises a board, wiring formed on the board, connecting terminals according to the invention with a portion of the wiring as the conductive layer, and a semiconductor chip mounted on the board in a manner electrically connected with the connecting terminals.

The method for manufacturing a semiconductor package according to the invention comprises a step in which an electroless nickel plating film, a first palladium plating film which is a displacement or electroless palladium plating film with a purity of 99% by mass or greater, a second palladium plating film which is an electroless palladium plating film with a purity of at least 90% by mass and less than 99% by mass, and a displacement gold plating film are formed in that order on the surface of part of a conductive layer formed on a board, to form connecting terminals that comprise parts of the conductive layer, the first palladium plating film, the second palladium plating film and the displacement gold plating film, and a step in which a semiconductor chip is mounted on the board in a manner electrically connected to the connecting terminals.

In the step of forming the connecting terminals each having a plating film, an electroless gold plating film may be further laminated on the displacement gold plating film.

According to the manufacturing method of the invention, it is possible to manufacture a semiconductor package with excellent connection reliability. Furthermore, if an electroless gold plating film is further laminated on the displacement gold plating film in the connecting terminal-forming step, it is possible to manufacture a semiconductor package having sufficient bond strength particularly for wires such as gold wires.

Effect of the Invention

According to the invention it is possible to improve the connection reliability of connecting terminals having displacement gold plating films. More specifically, the bond strength between connecting terminals and gold wire and/or solder is increased.

BRIEF DESCRIPTION OF THE DRAWINGS

FIG. 1(a) is a schematic plan view showing an embodiment of a semiconductor chip mounting board provided with connecting terminals as seen from the first main side, (b) is a cross-sectional view along line b-b in (a), and (c) is a cross-sectional view along line c-c in (a).

FIG. 9(a) is a schematic plan view showing an embodiment of a semiconductor chip mounting board having semiconductor package regions arranged in a plurality of rows and columns, and (b) is a magnified view of region A.

Figure 2:
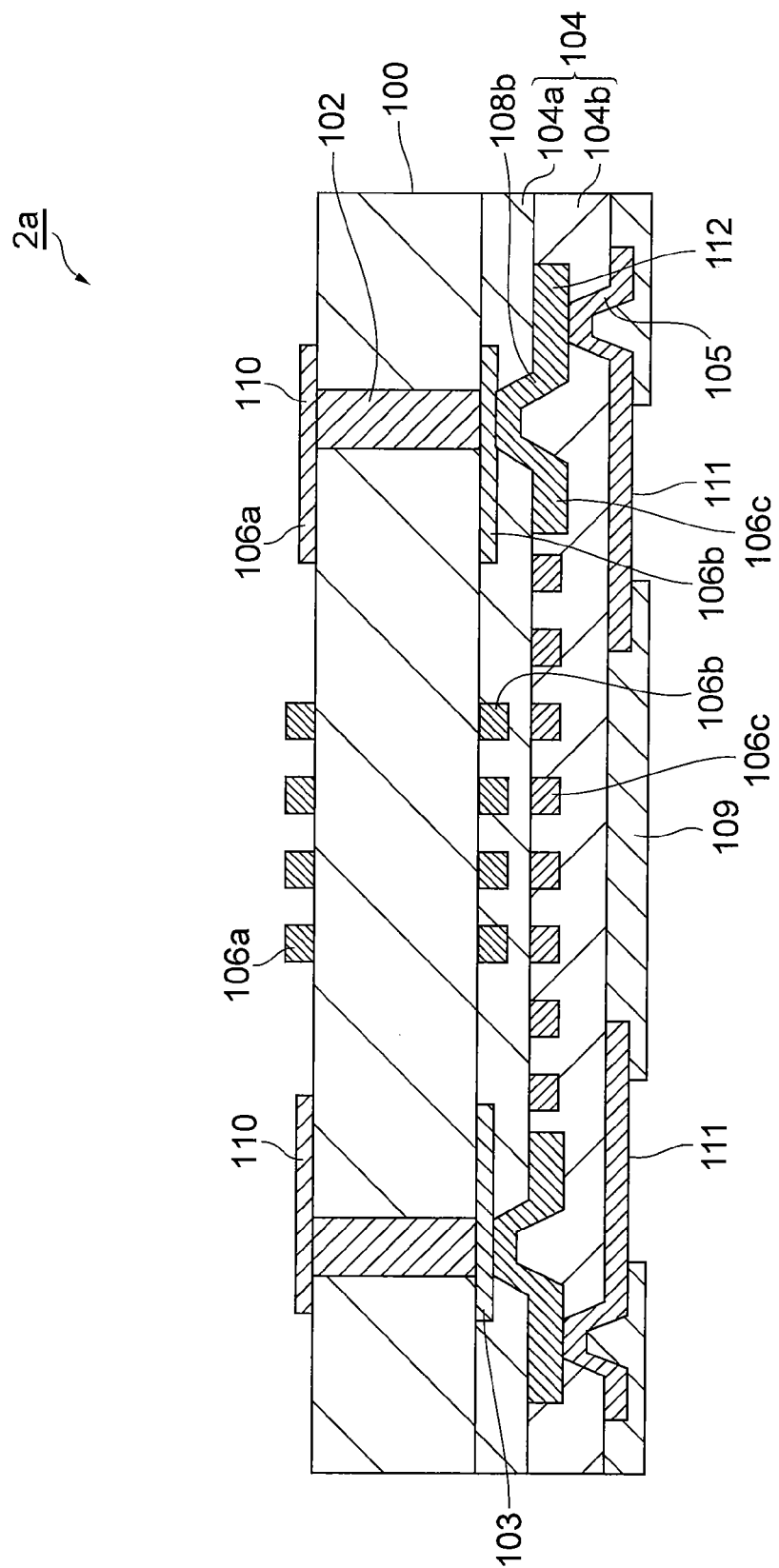
FIG. 2 is a schematic cross-sectional view showing an embodiment of the semiconductor chip mounting board.

EXPLANATION OF SYMBOLS 1a, 2a, 3a, 4a, 5a, 6g: Semiconductor chip mounting board, 2: conductive layer, 3: electroless nickel plating film, 4: first palladium plating film, 5: second palladium plating film, 6: displacement gold plating film, 6a, 6b, 6c, 6d, 6e, 6f: structure during semiconductor chip mounting board manufacture, 7a: wire bond type semiconductor package, 8a: flip-chip type semiconductor package, 9a: semiconductor chip mounting board, 11: locating mark, 13: semiconductor package region, 14: die bond film-bonding region (flip-chip type), 15: semiconductor chip mounting region (flip-chip type), 17: die bond film-bonding region (wire bond type), 18: semiconductor chip mounting region (wire bond type), 22: circuit board for semiconductor chip mounting board, 23: block, 24: reinforcing pattern, 25: cut positioning mark, 40: deployment wiring, 50: printed circuit board, 60: plating layer, 100: core board, 102: first interlayer connection IVH, 103: second interlayer connection terminal, 104: build-up layer, 104a: first build-up layer, 104b: first build-up layer, 105: IVH for third interlayer connection, 106a: first wiring, 106b: second wiring, 106c: third wiring, 108a: through-hole for second interlayer connection IVH, 108b: second interlayer connection IVH, 109: insulating layer, 109a: opening, 110: wire bonding connecting terminal, 111: solder connecting terminal, 112: third interlayer connection terminal, 113: underfill material, 114: solder ball, 115: gold wire, 116: semiconductor sealing resin, 117: die bond film, 118: insulating layer, 118a: opening, 119: connection bump, 120: semiconductor chip.

BEST MODE FOR CARRYING OUT THE INVENTION

Examples of preferred embodiments of the invention will now be explained with reference to the accompanying drawings where necessary. Throughout the explanation of the drawings, identical or corresponding elements will be referred to by like reference numerals and will be explained only once.

(Semiconductor Chip Mounting Board)

FIG. 1 is a plan view and cross-sectional view showing an embodiment of a semiconductor chip mounting board. FIG. 1(a) is a plan view schematically showing the semiconductor chip mounting board from the first main side. FIG. 1(b) is a cross-sectional view along line b-b of FIG. 1(a). FIG. 1(c) is a cross-sectional view along line c-c of FIG. 1(a). The semiconductor chip mounting board 1a shown in FIG. 1 comprises a printed circuit board 50, and solder connecting terminals 111 and an insulating layer 109 formed on one surface of the core board 100 serving as the insulating layer of the printed circuit board 50. The printed circuit board 50 comprises an insulating layer 118 having openings 118a formed on the other surface of the core board 100, a plurality of wire bonding connecting terminals 110 arranged within the openings 118a, and deployment wiring 40.

The plurality of wire bonding connecting terminals 110 function as semiconductor chip connecting terminals for electrical connection between the semiconductor chip mounting board 1a and the semiconductor chip. The plurality of solder connecting terminals 111 function as external connecting terminals for electrical connection between the semiconductor chip mounting board 1a and the circuit board (motherboard). The wire bonding connecting terminals 110 and solder connecting terminals 111 are electrically connected by the deployment wiring 40. The printed circuit board 50 may also be a multilayer printed circuit board.

FIG. 1(b) is a cross-sectional view of the wire bonding connecting terminals 110 and their periphery along line b-b, in the semiconductor chip mounting board 1a of FIG. 1(a). Each wire bonding connecting terminal 110 comprises a conductive layer 2 formed on the first main side of the core board 100, and a plating layer 60 laminated on the conductive layer 2. The plating layer 60 comprises an electroless nickel plating film 3, a first palladium plating film 4 with a purity of 99% by mass or greater, a second palladium plating film 5 with a purity of at least 90% by mass and less than 99% by mass, and a displacement gold plating film 6. The plurality of conductive layers 2 may also be part of the deployment wiring 40.

FIG. 1(c) is a cross-sectional view of the solder connecting terminals 111 and their periphery along line c-c, in the semiconductor chip mounting board 1a of FIG. 1(a). Each solder connecting terminal 111 comprises a conductive layer 2 formed on the second main side of the core board 100, and a plating layer 60 laminated on the conductive layer 2. The plating layer 60 comprises an electroless nickel plating film 3, a first palladium plating film 4 with a purity of 99% by mass or greater, a second palladium plating film 5 with a purity of at least 90% by mass and less than 99% by mass, and a displacement gold plating film 6. The plurality of conductive layers 2 may also be part of the deployment wiring 40, as mentioned above.

The conductive layer 2 comprises copper, tungsten, molybdenum, aluminum or an alloy containing the foregoing. The electroless nickel plating film 3 is formed by reducing the nickel ion in the plating solution to nickel with the reducing agent, depositing it on the surface of the activated conductive layer 2. Therefore, the conductive layer 2 may be any metal or alloy so long as an electroless nickel plating film 3 can be formed on the surface of the metal or alloy. A catalyst (for example, palladium catalyst) is usually added to the surface of the conductive layer before electroless nickel plating on the conductive layer.

The electroless nickel plating film 3 may be an electroless nickel-phosphorus alloy plating film, electroless nickel-boron alloy plating film, electroless nickel-nitrogen alloy plating film or the like, containing phosphorus, boron, nitrogen or the like as an element resulting from the reducing agent used to form the electroless nickel plating film. The purity (nickel content) of the electroless nickel plating film 3 is preferably at least 80% by mass and more preferably at least 90% by mass. The film thickness of the electroless nickel plating film 3 is preferably 0.1 µm to 20 µm and more preferably 0.5 µm to 10 µm.

The first palladium plating film 4 having a palladium purity of 99% by mass or greater is formed from a displacement palladium plating or electroless palladium plating. The displacement palladium plating film is formed by displacement reaction with the electroless nickel plating film 3 laminated on the uppermost surface layer of the conductive layer 2. There are no particular restrictions on the constituent elements other than palladium, so long as they undergo displacement deposition with the nickel plating film 3. The electroless palladium plating film is obtained by deposition of palladium ion in the plating solution as palladium on the surface of the electroless nickel film 3 by the action of the reducing agent. The first palladium plating film 4 with a purity of 99% by mass or greater is preferably formed by electroless palladium plating using a formic acid compound as the reducing agent. Using a formic acid compound will allow a high purity plating film to be deposited particularly easily and uniformly. The deposition form of the palladium will have more excellent homogeneity with a purity closer to 100% by mass.

The film thickness of the first palladium plating film 4 is preferably not greater than 0.4 µm, more preferably 0.001 µm to 0.4 µm, even more preferably 0.01 µm to 0.2 µm and most preferably 0.03 µm to 0.1 µm. If the film thickness of the first palladium plating film 4 is less than 0.001 µm, it may be difficult to evenly deposit the second palladium plating film 5 on all of the terminals.

The second palladium plating film 5 with a palladium purity of at least 90% by mass and less than 99% by mass is preferably formed by electroless palladium plating using hypophosphorous acid or phosphorous acid, having lower activity than formic acid, as the reducing agent.

The second palladium plating film 5 will usually be formed using as the reducing agent a plating solution containing a phosphorus-containing compound such as hypophosphorous acid or phosphorous acid, or a boron-containing compound. Such plating solutions are used to form a palladium-phosphorus plated alloy film or palladium-boron alloy film. The reducing agent concentration, pH and bath temperature for the plating solution are adjusted for a palladium purity of at least 90% by mass and less than 99% by mass. Specifically, when using hypophosphorous acid as the reducing agent, for example, it is possible to form a palladium plating film 5 with a palladium purity of at least 90% by mass and less than 99% by mass with a concentration of 0.005-0.3 mol/l, a pH of 7.5-11.5 and a temperature in the range of 40-80° C.

The film thickness of the second palladium plating film 5 is preferably 0.03 µm to 0.5 µm, more preferably 0.04 µm to 0.3 µm and most preferably 0.06 µm to 0.2 µm.

The sum of the film thicknesses of the first palladium plating film 4 and second palladium plating film 5 is preferably 0.03 to 0.5 µm, more preferably 0.04 to 0.3 µm and most preferably 0.06 to 0.2 µm.

The displacement gold plating film 6 is formed on the surface of the second palladium plating film 5 by displacement reaction between the second palladium plating film 5 ground layer and the gold ion in the solution. There are no particular restrictions on the plating solution so long as the palladium and gold ion are exchanged, but it preferably contains a cyanogen compound.

The solder connecting terminals 111, which are connecting terminals comprising the aforementioned conductive layer 2, electroless nickel plating film 3, first palladium plating film 4 with a purity of 99% by mass or greater, second palladium plating film 5 with a purity of at least 90% by mass and less than 99% by mass, and displacement gold plating film 6, have excellent solder connection reliability.

While not shown in the drawings, an electroless gold plating film is also preferably laminated on the surface of the displacement gold plating film 6. The electroless gold plating film is a reduction-type electroless gold plating film. Electroless gold plating allows adjustment of the film thickness of the gold plating film, to improve the wire bonding connection reliability of the wire bonding connecting terminal 110.

The purity of the electroless gold plating film is preferably at least 99% by mass and more preferably at least 99.5% by mass. If the purity of the electroless gold plating film is less than 99% by mass, the wire bonding property and solder connection reliability will tend to be lower than when it is 99% by mass or greater. The electroless gold plating film may also be obtained using a displacement-reduction-type gold plating solution (a displacement gold plating solution with a reducing agent in the plating solution, which like electroless gold plating allows greater thickness than ordinary displacement gold plating).

From the viewpoint of the wire bonding property, the sum of the thicknesses of the displacement gold plating film 6 and electroless gold plating film is preferably 0.04 µm to 3 µm, more preferably 0.06 µm to 1 µm and even more preferably 0.1 µm to 0.5 µm. A particularly satisfactory wire bonding property is obtained if the sum of the thicknesses of the displacement gold plating film 6 and electroless gold plating film is at least 0.04 µm. If the sum of the thicknesses of the displacement gold plating film 6 and electroless gold plating film exceeds 3 µm, no notable improvement will be obtained, and the economy will be reduced, compared to a sum of up to 3 µm. A displacement gold plating film alone may be used from the viewpoint of solder connection reliability, but from the viewpoint of the wire bonding property it is more preferred to carry out electroless gold plating. From the viewpoint of the solder connection reliability, the sum of the thicknesses of the displacement gold plating film and electroless gold plating film is preferably 0.005 µm to 3 µm, more preferably 0.01 µm to 0.5 µm and even more preferably 0.04 µm to 0.2 µm. The sum of the thicknesses of the displacement gold plating film and electroless gold plating film may be 0.005 µm or greater to obtain more satisfactory solder connection reliability. If the sum of the thicknesses of the displacement gold plating film and electroless gold plating film is greater than 3 µm, no notable improvement will be obtained, and the economy will be reduced, compared to a sum of up to 3 µm.

When the displacement gold plating film 6 does not also have an electroless gold plating film over it, the thickness of the displacement gold plating film 6 alone is preferably at least 0.005 µm from the viewpoint of solder connection reliability.

The wire bonding connecting terminal 110 is connected to a semiconductor chip mounted on the semiconductor chip mounting board by conducting wires, for example. The solder connecting terminals 111 are connected to a circuit board (motherboard) by solder balls, for example.

The conducting wires for connection between the wire bonding connecting terminals 110 and semiconductor chip are preferably gold wires.

The solder used for connection between the solder connecting terminals 111 and circuit board (motherboard) may be any solder such as a solder for a solder ball, a solder for surface mount electronic parts or a circuit board, a solder for use on semiconductor chips, or a solder for a solder bump and the like. The solder form may be, for example, spherical, hemispherical, cubic, cuboid or projection-like. There may also be used eutectic solder comprising 60% tin and 40% lead, lead-free tin, or a tin alloy containing one or more elements from among silver, copper, zinc, bismuth, germanium, palladium, nickel and indium. Specifically, Sn-3.0Ag-0.5Cu may be used.

Figure 3:
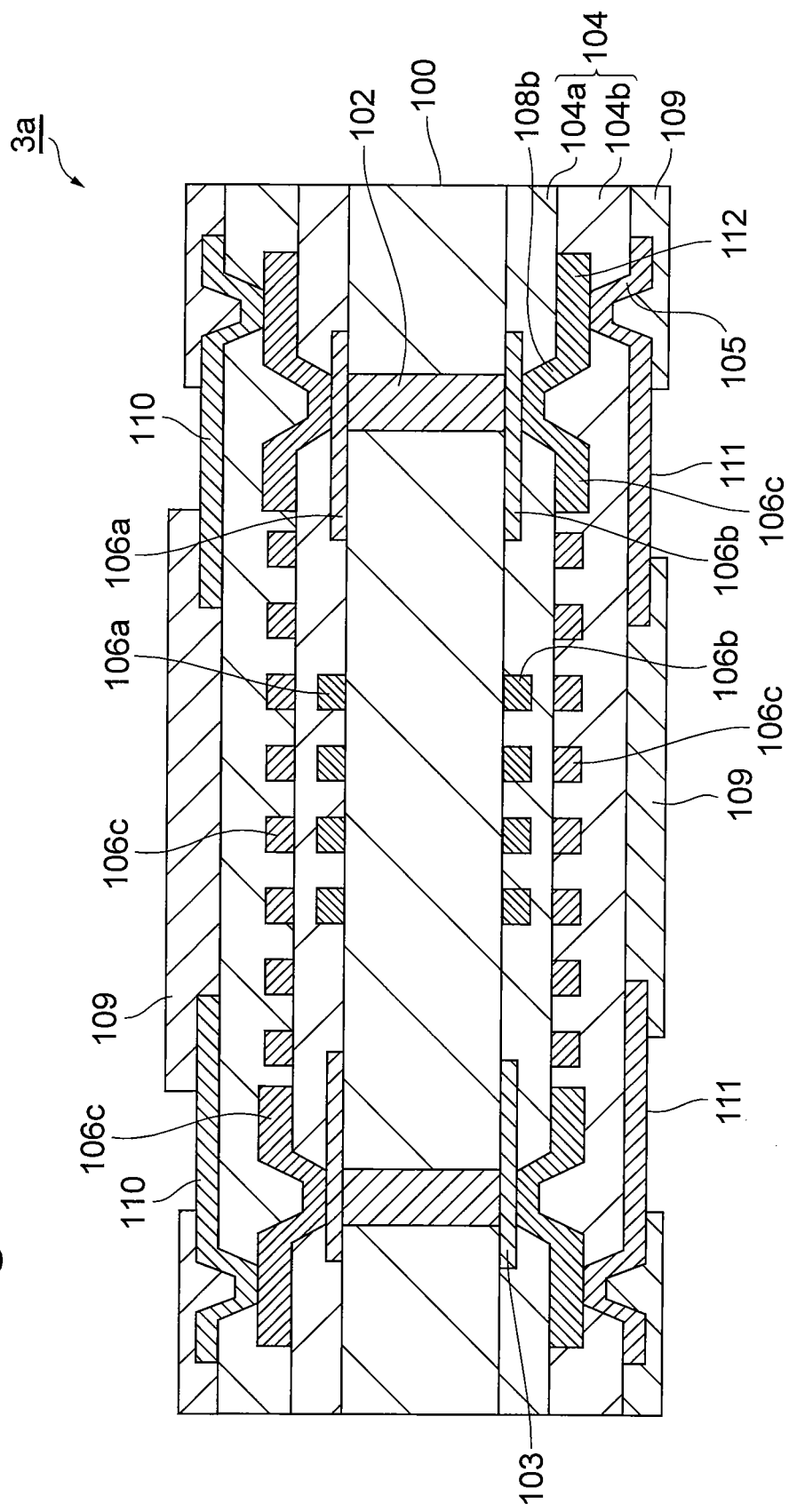
FIG. 3 is a schematic cross-sectional view showing another embodiment of the semiconductor chip mounting board.

FIG. 2 and FIG. 3 are schematic cross-sectional views showing embodiments of a semiconductor chip mounting board. In the embodiment shown in FIG. 2, a build-up layer is formed on one side of the core board, while in the embodiment shown in FIG. 3, build-up layers are formed on both sides of the core board. The embodiment of FIG. 2 will now be explained in detail.

The semiconductor chip mounting board 2a shown in FIG. 2 comprises a core board 100 as an insulating layer, a first wiring 106a formed on one side of the core board 100, a plurality of build-up layers 104a, 104b laminated on the other side of the core board 100, and solder connecting terminals 111 formed on the side of the build-up layer 104b opposite the core board 100 side, positioned on the outermost layer. The first wiring 106a has a wire bonding connecting terminal 110. The solder connecting terminals 111 are connected to a motherboard. When the build-up layer is also formed on the first wiring 106a side as in the embodiment shown in FIG. 3, the connecting terminal 110 functions as a first interlayer connection terminal.

On the side of the core board 100 opposite the first wiring 106a, there is formed a second wiring 106b containing a second interlayer connection terminal 103. The wire bonding connecting terminal 110 and second interlayer connection terminal 103 are electrically connected via a first interlayer connection IVH (interstitial via hole) 102 passing through the core board 100. On the second wiring 106b side of the core board there are laminated a build-up layer 104a and build-up layer 104b in that order. On the side of the build-up layer 104a opposite the core board 100 there is formed a third wiring 106c comprising a third interlayer connection terminal 112. The second interlayer connection terminal 103 and third interlayer connection terminal 112 are electrically connected via a second interlayer connection IVH 108b.

On the side of the build-up layer 104b as the outermost layer, opposite the core board 100, there are provided solder connecting terminals 111 and an insulating coating 109 such as solder resist. Openings are formed in the insulating coating 109 whereby the solder connecting terminals 111 are exposed. The solder connecting terminal 111 and second interlayer connection terminal 112 are electrically connected via a third interlayer connection IVH 105.

The wiring shapes and placement of each of the connecting terminals are not particularly restricted, and may be appropriately designed according to the semiconductor chip that is to be mounted and the desired semiconductor package.

The material of the core board 100 is also not particularly restricted, and organic base, ceramic base, silicon base or glass base material may be used. From the viewpoint of the thermal expansion coefficient and insulating properties, it is preferred to use a ceramic base or glass base material.

As non-photosensitive glass of the glass, in particular, there may be mentioned soda lime glass (composition examples: $SiO_2$ 65-75% by mass, $Al_2O_3$ 0.5-4% by mass, CaO 5-15% by mass, MgO 0.5-4% by mass, $Na_2O$ 10-20% by mass), borosilicate glass (composition examples: $SiO_2$ 65-80% by mass, $B_2O_3$ 5-25% by mass, $Al_2O_3$ 1-5% by mass, CaO 5-8% by mass, MgO 0.5-2% by mass, $Na_2O$ 6-14% by mass, $K_2O$ 1-6% by mass), and the like. As photosensitive glass there may also be mentioned glass containing gold ions and silver ions as photosensitive agents in $Li_2O$—$SiO_2$ based crystallized glass.

As organic boards there may be used boards obtained by laminating resin-impregnated materials onto glass cloths, or resin films. As resins to be used there may be mentioned thermosetting resins, thermoplastic resins, and mixtures thereof. A resin composed mainly of a thermosetting organic insulating material is preferred. As thermosetting resins there may be used phenol resins, urea resins, melamine resins, alkyd resins, acrylic resins, unsaturated polyester resins, diallyl phthalate resins, epoxy resins, polybenzoimidazole resins, polyamide resins, polyamideimide resins, silicone resins, resins synthesized by cyclopentadiene, tris(2-hydroxyethyl) isocyanurate-containing resins, resins synthesized by aromatic nitrile, trimerized aromatic dicyanamide resins, triallyl trimethacrylate-containing resins, furan resins, ketone resins, xylene resins, fused polycyclic aromatic ring-containing thermosetting resins, benzocyclobutene resins, and the like. As thermoplastic resins there may be mentioned polyimide resins, polyphenylene oxide resins, polyphenylene sulfide resins, aramid resins, liquid crystal polymers, and the like.

Fillers may also be added to these resins. As fillers there may be mentioned silica, talc, aluminum hydroxide, aluminum borate, aluminum nitride, alumina and the like.

The thickness of the core board 100 is preferably 100 to 800 μm and more preferably 150 to 500 μm from the viewpoint of IVH formability.

The surface roughness Ra of the wirings such as the first wiring 106a is preferably 0.01 μm-0.4 μm. By coating a metal selected from among copper, tin, chromium, nickel, zinc, aluminum, cobalt, gold, platinum, silver and palladium, or a metal composed of an alloy containing these metals, continuously or discretely on the surface of copper wiring to a film thickness of at least 5 nm and not greater than 0.4 μm, it is possible to form wiring with a surface roughness Ra of 0.01 μm-0.4 μm. As a preferred form, copper, tin, chromium, nickel, zinc, aluminum, cobalt or an alloy containing these metals cover the surface of copper wiring, or after the covering it is converted to an oxide, hydroxide or a combination thereof, to form a layer of these metal oxides and/or hydroxides on the wiring surface layer and in the wiring. Metals such as molybdenum, titanium, tungsten, lead, iron, indium, thallium, bismuth, ruthenium, rhodium, gallium and germanium may also be used instead of the metals mentioned above, and an alloy containing one or more of these may also be used. As methods for attaching these metals to wiring surfaces there may be mentioned electroless plating, electroplating, displacement reaction, spray atomizing, coating, sputtering, vapor deposition and the like.

An insulating material may be used for the interlayer insulating layers (build-up layers) 104a, 104b. As insulating materials there may be used thermosetting resins, thermoplastic resins and mixtures thereof. The build-up layer is preferably composed mainly of a thermosetting organic insulating material. As thermosetting resins and thermoplastic resins there may be used the same resins mentioned above.

A filler may also be added to the insulating material. As fillers there may be mentioned silica, talc, aluminum hydroxide, aluminum borate, aluminum nitride, alumina and the like.

In a semiconductor package, preferably the thermal expansion coefficient of the semiconductor chip and the thermal expansion coefficient of the core board are similar and the thermal expansion coefficient of the core board and the thermal expansion coefficient of the build-up layer are similar, and more preferably the thermal expansion coefficients of the semiconductor chip, core board and build-up layer ($\alpha 1$, $\alpha 2$, $\alpha 3$ (ppm/° C.), respectively) are in the relationship $\alpha 1 \leq \alpha 2 \leq \alpha 3$.

Specifically, the thermal expansion coefficient $\alpha 2$ of the core board is preferably 7-13 ppm/° C. and more preferably 9-11 ppm/° C. The thermal expansion coefficient $\alpha 3$ of the build-up layer is preferably 10-40 ppm/° C., more preferably 10-20 ppm/° C. and even more preferably 11-17 ppm/° C.

The Young's modulus of the build-up layer is preferably 1-5 GPa from the viewpoint of stress relaxation against heat stress. Preferably, the amount of filler added to the build-up layer is appropriately adjusted so that the thermal expansion coefficient of the build-up layer is 10-40 ppm/° C. and the Young's modulus is 1-5 GPa.

Figure 4:
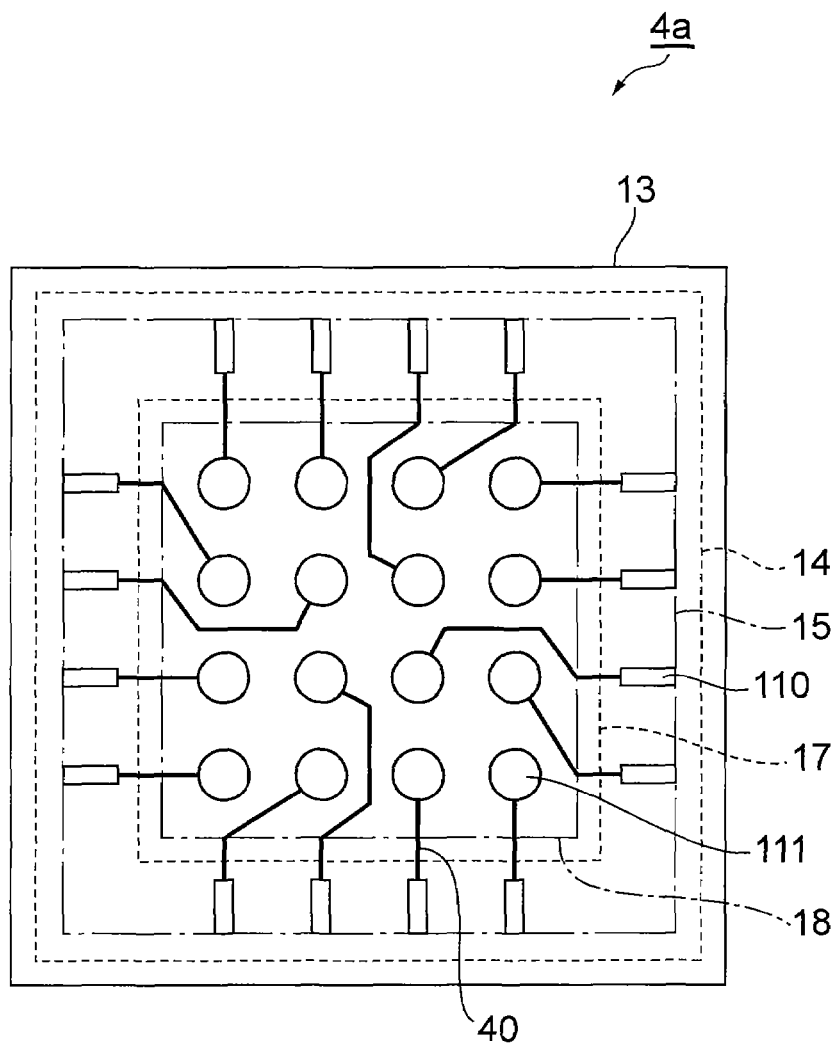
FIG. 4 is a schematic plan view of an embodiment (fan-in type) of the semiconductor chip mounting board.
Figure 5:
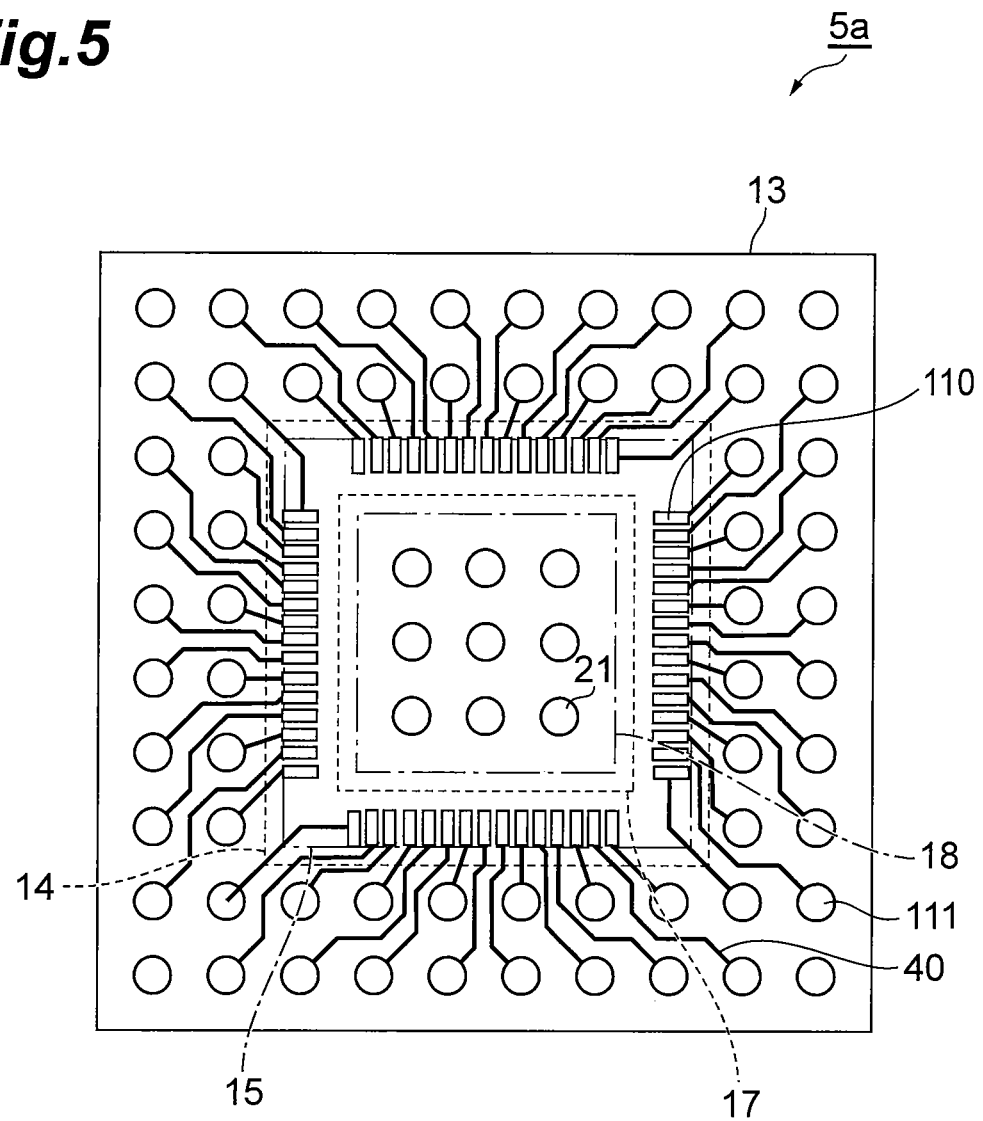
FIG. 5 is a schematic plan view of another embodiment (fan-out type) of the semiconductor chip mounting board.

FIG. 4 and FIG. 5 are schematic plan views showing embodiments of a semiconductor chip mounting board. The semiconductor chip mounting board 4a shown in FIG. 4 is a fan-in type having solder connecting terminals 111 formed on the inner side from the wire bonding connecting terminals 110. The semiconductor chip mounting board 5a shown in FIG. 5 is a fan-out type having solder connecting terminals 111 formed on the outer side from the wire bonding connecting terminals 110. The semiconductor chip mounting board may also be a combination of a fan-in type and fan-out type. The shapes of the wire bonding connecting terminals 110 are not particularly restricted so long as they allow wire bond connection or flip-chip connection.

Wire bond connection or flip-chip connection may be used for either a fan-in or fan-out type. FIGS. 4 and 5 show the semiconductor chip mounting region 18 and die bond film-bonding region 17 for wire bond connection, and the semiconductor chip mounting region 15 and die bond film-bonding region 14 for flip-chip connection, for fan-in and fan-out types, respectively. If necessary, a dummy pattern 21 that is not electrically connected to the semiconductor chip may also be formed, as shown in FIG. 5. There are no particular restrictions on the shape and arrangement of the dummy pattern, but it is preferably arranged in a uniform manner in the semiconductor chip mounting region 18. This will impede formation of voids when the semiconductor chip is mounted on the die bond film-bonding region 17 using a die bond adhesive, thus further improving the connection reliability for wire bonding connection.

(Method for Manufacturing Semiconductor Chip Mounting Board)

An embodiment of a method for manufacturing a semiconductor chip mounting board will now be explained.

Figure 6:
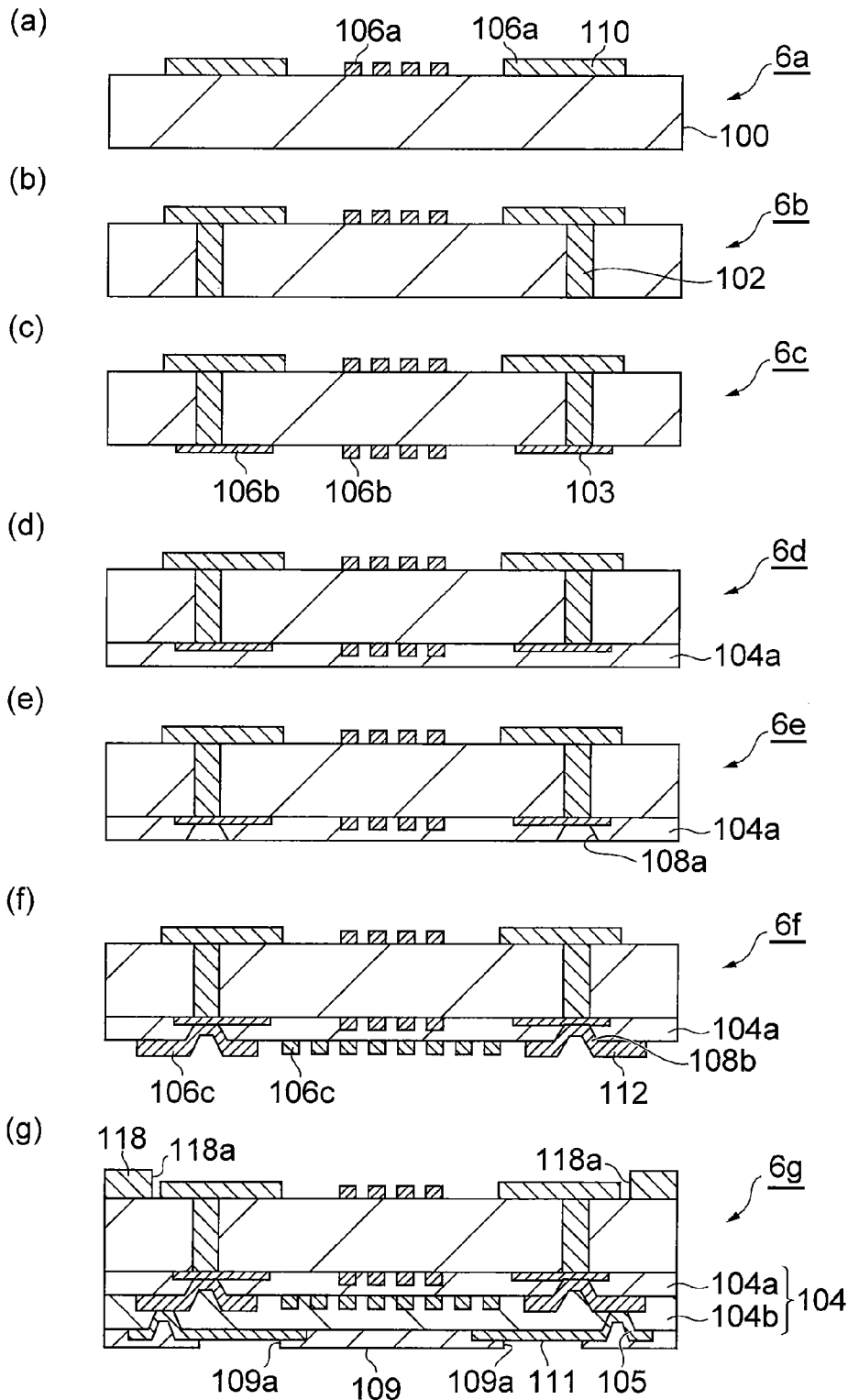
FIG. 6 is a schematic cross-sectional view showing an embodiment of a method for manufacturing a semiconductor chip mounting board.

FIG. 6(*a*)-(*g*) are schematic cross-sectional views of an embodiment of a method for manufacturing a semiconductor chip mounting board. A semiconductor chip mounting board 6g may be obtained by a manufacturing method comprising a step of forming a first wiring 106a containing wire bonding connecting terminals 110 on the first main side of a core board 100 (step a), a step of forming first interlayer connection IVHs 102 (hereinafter "first via holes") running through the core board 100 for connection with the wire bonding connecting terminals 110 (step b), a step of forming a second wiring 106b containing second interlayer connection terminals 103 on the second main side of the core board 100 opposite the first wiring 106a (step c), a step of forming a first build-up layer (interlayer insulating layer) 104a on the second main side of the core board 100 (step d), a step of forming through-holes 108a for second interlayer connection IVHs (via holes) 108b running through the first build-up layer 104a (step e), a step of forming second interlayer connection IVHs (via holes) 108b and a third wiring 106c containing third interlayer connection terminals 112 on the side of the first build-up layer 104a opposite the core board 100 (step f), and a step of forming a second build-up layer 104b on the side of the first build-up layer 104a opposite the core board 100, forming third interlayer connection IVHs 105 running through the second build-up layer 104b, forming solder connecting terminals 111 on the side of the second build-up layer 104b opposite the core board 100, and then forming an insulating film 109 having openings 109a through which the solder connecting terminals 111 are exposed (step g).

The wire bonding connecting terminals 110 and solder connecting terminals 111 are each formed by a method comprising a step in which an electroless nickel plating film, a first palladium plating film which is a displacement or electroless palladium plating film with a purity of 99% by mass or greater, a second palladium plating film which is an electroless palladium plating film with a purity of at least 90% by mass and less than 99% by mass, and a displacement gold plating film are formed in that order on the surface of a conductive layer as part of the wiring, to form connecting terminals that comprise a first palladium plating film, a second palladium plating film and a displacement gold plating film, on a portion of the wiring.

In the step of forming the connecting terminals having each plating films, an electroless gold plating film may be further laminated on the displacement gold plating film from the viewpoint of further improving the bond strength of the wire bonding connecting terminal. The wire bonding connecting terminals 110 and solder connecting terminals 111 are formed by a method comprising a step of forming connecting terminals that comprise a first palladium plating film, a second palladium plating film and a displacement gold plating film, as well as an electroless gold plating film, on a portion of the wiring.

[Step a]

In step a, the first wiring 106a comprising the wire bonding connecting terminals 110 is formed on the first main side of the core board 100, as shown in FIG. 6(*a*). The plating treatment is carried out on the surface of part of the copper layer as the patterned wiring composing the first wiring 106a, so that the wire bonding connecting terminals 110 are formed. The copper layer on the core board is formed by a method in which, after a copper thin-film has been formed on the core board surface by sputtering, vapor deposition, plating or the like, electrolytic copper plating is carried out until the film thickness reaches a prescribed thickness.

The method for forming the patterned wiring on the core board may be a method of forming a metal foil on the core board surface or build-up layer and removing the unwanted sections of the metal foil by etching (subtractive process), a method of forming wiring by electrolytic plating only on the necessary sections of the core board surface or build-up layer (additive process), or a method of forming a thin metal layer (seed layer) on the core board surface or build-up layer, subsequently forming the necessary wiring by electrolytic plating, and then removing the thin metal layer by etching (semi-additive process).

Each of these methods for forming wiring on a core board will now be explained.

<Subtractive Process>

In a subtractive process, a copper foil is formed on the surface of the core board 100 and the unwanted sections of the copper foil are then removed by etching. An etching resist is formed on the sections of the copper foil that are to form the wiring, i.e. the sections that are to serve as the first wiring 106a, a chemical etching solution is spray atomized onto the sections exposed from the etching resist, and the unwanted metal foil is removed by etching to form the first wiring 106a. The etching resist may be any etching resist material that can generally be used for circuit boards. The etching resist can be formed by silk screen printing of a resist ink, or by laminating a negative photosensitive dry film for an etching resist on a copper foil, layering thereover a light-transmitting photomask in the shape of the wiring, exposing it to ultraviolet rays, and removing the non-exposed sections with a developing solution. The chemical etching solution used may be a chemical etching solution ordinarily used for circuit boards, such as a solution of cupric chloride and hydrochloric acid, a ferric chloride solution, a solution of sulfuric acid and hydrogen peroxide or an ammonium persulfate solution.

<Additive Process>

In an additive process, plating is carried out on necessary sections of the surface of the core board 100 to form the first wiring 106a. For example, after the electroless plating catalyst is attached to the surface of the core board 100, a plating resist is formed on the surface sections that are not to be plated. Next, the core board 100 on which the plating resist has been formed is immersed in an electroless plating solution to form copper wiring and copper terminals by electroless plating only on the sections that are not covered by the plating resist.

<Semi-Additive Process>

In a semi-additive process, a seed layer is formed on the surface of the core board 100, and then a plating resist is formed in the necessary pattern and electrolytic plating is performed to form the first wiring 106a. Next, the plating resist is released and the seed layer is removed by etching. The method for forming the seed layer may be (a) a vapor deposition method, (b) a plating method or (c) a metal foil attachment method. These methods allow metal foils to be used in the subtractive process.

In a vapor deposition method (a), a seed form composed of a ground layer metal and a thin-film copper layer is formed by sputtering, for example. The seed layer can be formed using bipolar sputtering, tripolar sputtering, quadripolar sputtering, magnetron sputtering, mirror tron sputtering, or the like. The target used for sputtering may be Cr, Ni, Co, Pd, Zr, Ni/Cr or Ni/Cu, for example, in order to ensure adhesiveness as the ground layer metal. The thickness of the ground layer metal is preferably 5-50 nm. Sputtering is then performed using copper as the target, and a thin-film copper layer is formed to a thickness of 200-500 nm to form a seed layer.

In a plating method (b), electroless copper plating on the core board surface allows formation of a seed layer to a thickness of 0.5-3 μm.

In a metal foil attachment method (c), if the core board has an adhesive function, a metal foil can be attached by pressing or laminating to form the seed layer. However, because it is extremely difficult to directly attach thin copper foils, there may be employed a method of first attaching a thick metal foil and then etching to reduce its thickness, or a method of first attaching a carrier-bearing copper foil and then releasing the carrier layer. For the former method, a trilayer copper foil having the structure: carrier copper/nickel/thin-film copper may be used. Using such a method, the carrier copper may be removed with an alkali etching solution and the nickel removed with a nickel etching solution. For the latter method, a peelable copper foil comprising aluminum, copper, an insulating resin or the like as the carrier may be used. By using such a method, it is possible to form a seed layer with a thickness of 5 μm or smaller.

Incidentally, a copper foil with a thickness of 9-18 μm may be attached to the core board 100 and etched to uniformly reduce the thickness to 5 μm or less to form the seed layer.

The plating resist is formed into the required pattern on the seed layer that has been formed by a method as described above, and wiring may be formed by electrolytic copper plating through the seed layer. Next, the plating resist is released and finally the seed layer is removed by etching to form a first wiring 106a on the surface of the core board 100.

After forming a thin-film by the vapor deposition method (a), plating method (b) or copper foil attachment method (c), plating is performed to the desired copper film thickness by electrolytic copper plating to form a copper layer on the board. An etching resist with the prescribed shape is formed on the copper layer that has been formed on the core board, and an etching solution of copper chloride or iron chloride is used to create copper wiring and copper terminals.

When the wiring is fine wiring of L/S=35 μm/35 μm or smaller, the method of forming the wiring is most preferably a semi-additive process.

When the wiring is to be formed by a semi-additive process, the area ratio (=S'/S) between the cross-sectional area (S) at the wiring section containing the electrolytic copper plating layer and the seed layer as the layer below the electrolytic copper plating layer, with the plating resist released, and the cross-sectional area (S') at the wiring section containing the electrolytic copper plating layer and the seed layer as the layer below the electrolytic copper plating layer after the seed layer has been removed by etching, or after the wiring surface has been treated to a surface roughness Ra of 0.01-0.4 μM and an insulating film containing one or more coupling agents or the like, described hereunder, has been formed, is preferably 0.5-1.0 and more preferably 0.7-1.0.

[Step b]

In step b, first interlayer connection IVHs 102 are formed for connection between the wire bonding connecting terminals 110 and the second wiring 106b described hereunder, as shown in FIG. 6(b).

When the core board 100 is a non-photosensitive base, laser light may be used to form the through-holes (IVHs) for the first via holes 102. The non-photosensitive glass mentioned above is an example of a non-photosensitive base. The laser light used may be, for example, from a $CO_2$ laser, YAG laser, excimer laser or the like. The photosensitive glass mentioned above may be used as the non-photosensitive base.

When the core board 100 is a photosensitive base, the regions other than the first via holes 102 are masked and the sections where the first via holes 102 are to be formed are irradiated with ultraviolet light. After irradiating the ultraviolet light, the IVHs may be formed by heat treatment and etching. The photosensitive glass mentioned above may be used as the photosensitive base.

When the core board 100 is a base that can be chemically etched with a chemical solution such as an organic solvent, it is possible to form through-holes by chemical etching. The conductive layer is formed by filling the formed IVHs with a conductive paste or plating in the formed IVHs, to create first via holes 102. Because the first via holes 102 are filled with a conductor, or a conductive layer is formed, it is possible to accomplish electrical connection between the layers.

The method of forming the IVHs may also be, instead of the method described above, machining using a punch or drill, or dry etching using plasma.

[Step c]

In step c, second wiring 106b and second interlayer connection terminals 103 are formed on the second main side of the core board 100, opposite the first main side on which the first wiring 106a has been formed, as shown in FIG. 6(c). The second wiring 106b and second interlayer connection terminals 103 may be formed on the core board 100 in the same manner as the first wiring 106a and the wire bonding connecting terminals (first interlayer connection terminals) 110.

When the second wiring 106b and second interlayer connection terminals 103 are also to be formed by fine wiring, they may be formed by a semi-additive process, similar to the first wiring 106a and wire bonding connecting terminals (first interlayer connection terminals) 110.

[Step d]

In step d, a first build-up layer (interlayer insulating layer) 104a is formed on the side on which the second wiring 106b has been formed, as shown in FIG. 6(d).

A thermosetting resin, thermoplastic resin or a mixture of such resins may be used as the build-up layer. From the viewpoint of film thickness precision for the board, it is preferably composed mainly of a thermosetting material. The build-up layer may be obtained by printing or spin coating when a varnish-like material is used, or by lamination or pressing when a film-like insulating material is used. When the build-up layer contains a thermosetting material, it is preferred to heat cure the build-up layer.

[Step e]

Step e is a step in which through-holes 108a for the second interlayer connection IVHs 108b are formed in the first build-up layer 104a, as shown in FIG. 6(e). An ordinary laser drilling apparatus may be used to form the through-holes 108a for the second via holes 108b. The type of laser used for laser drilling may be a $CO_2$ laser, YAG laser, excimer laser or the like, although a $CO_2$ laser is preferred from the standpoint of productivity and hole quality. When the diameters of the IVHs 108a are less than 30 μm, a YAG laser that allows focusing of the laser light is preferred. When the build-up layer is composed of a material that allows chemical etching with a chemical solution such as an organic solvent, it is possible to form the IVHs by chemical etching.

The second interlayer connection IVHs 108b are formed by a method in which a conductive layer is formed by filling the formed IVHs 108a with conductive paste or plating in the formed IVHs 108a, in the same manner as the first interlayer connection IVHs 102. As the second interlayer connection IVHs 108b are filled with a conductor, or a conductive layer is formed, it is possible to accomplish electrical connection between the layers.

[Step f]

In step f, a third wiring 106c comprising third interlayer connection terminals 112 is formed on the surface of the first build-up layer 104a, as shown in FIG. 6(f). The third wiring 106c and third interlayer connection terminals 112 may be formed in the same manner as the first wiring 106a and the wire bonding connecting terminals (first interlayer connection terminals) 110. When the conductive layer of the second interlayer connection IVHs (via holes) 108b is to be formed by a plating process, for example, it may be formed simultaneously with the formation of the third wiring 106c.

The via holes in the build-up layer may be filled with a conductive paste or plated as described above in the through-holes of the build-up layer, to form the conductive layer. Lamination by pressing this on the core board 100 can produce a build-up layer with via holes.

[Step g]

In step g, a second build-up layer 104b is formed on the side of the first build-up layer 104a on which the third wiring 106c has been formed, which is the side opposite the core board 100, as shown in FIG. 6(g). The second build-up layer 104b can be formed in the same manner as the first build-up layer 104a.

Also, after the second build-up layer 104b has been formed in step g, third interlayer connection IVHs 105 are formed in the second build-up layer 104b and solder connecting terminals 111 are formed on the surface of the second build-up layer 104b. The solder connecting terminals 111 may be formed on the surface of the second build-up layer 104b in the same manner as the wire bonding connecting terminals (first interlayer connection terminals) 110. The third interlayer connection IVHs 105 may be formed in the same manner as the second interlayer connection IVHs 108b.

Steps d-f may be repeated to form a plurality of build-up layers each comprising wiring and interlayer connection terminals. However, when steps d-f are repeated to form a plurality of build-up layers each comprising wiring and interlayer connection terminals, the solder connecting terminals 111 are created as fourth interlayer connection terminals. The connecting terminals formed on the outermost build-up layer serve as the solder connecting terminals 111.

In step g, an insulating layer 109 is also formed on the surface of the second build-up layer 104b. Openings 109a are formed in the insulating layer 109 so that portions of the solder connecting terminals 111 are exposed. In addition, an insulating layer 118 is formed in the same manner on the first main side of the core board 100. Openings 118a are also formed on the surfaces of the wire bonding connecting terminals 110 and their periphery sections, so that they are exposed.

The insulating coating material used for the insulating layers 109 and 118 will usually be a solder resist. Although a thermosetting or ultraviolet curing resin may be used, an ultraviolet curing resin is preferred to allow precise finishing of the resist form. For example, an epoxy-based, polyimide-based, epoxy acrylate-based or fluorene-based material may be used. The pattern formation may be accomplished by printing in the case of a varnish-like material, but in order to ensure greater precision it is preferred to use a photosensitive solder resist, cover lay film or film-like resist.

The insulating coating may be used on only one side, but this may result in contraction during curing, tending to cause significant warping in the core board 100 if it is formed on only one side. It is therefore more preferable for the insulating coating to be formed on both sides of the semiconductor chip mounting board, as mentioned above. Furthermore, because warping will vary depending on the thickness of the insulating coating, the thickness of the insulating coating on both sides is more preferably adjusted so that warping does not occur. In this case, it is preferred for the thickness of the insulating coating on both sides to be determined by pre-examination. When a thin semiconductor package is to be formed, the thickness of the insulating coating is preferably not greater than 50 μm and more preferably not greater than 30 μm.

(Terminal Plating)

A plurality of plating films are laminated on the connecting terminals 110 that form a part of the first wiring 106a on the first main side of the core board 100 and the connecting terminals 111 on the uppermost surface layer of the second main side, that have been obtained in the manner described above. Specifically, by forming an electroless nickel plating film, a first palladium plating film which is a displacement or electroless palladium plating film with a purity of 99% by mass or greater, a second palladium plating film which is an electroless palladium plating film with a purity of at least 90% by mass and less than 99% by mass, and a displacement gold plating film, or additionally an electroless gold plating film, in that order on the surface of the conductor serving as part of the first wiring 106a and solder connecting terminal, it is possible to form connecting terminals with excellent solder connection reliability, and also connecting terminals with excellent wire bonding connection reliability.

At least one of the following steps: (A) a step of forming irregularities, (B) a step of forming a metal coat, (C) a step of forming a Si—O—Si bond, (D) a step of coupling treatment, (E) a step of applying a photocatalyst, (F) a step of treatment using an adhesive modifier, and (G) a step of treatment using a corrosion inhibitor, may be carried out on the surface of the wiring or terminals provided on the semiconductor chip mounting board as necessary, before forming the insulator or before forming the plating layer. Each step will now be described in detail. Steps (A)-(G) may be carried out in that order, or the order of the steps may be varied as described hereunder.

(A) Step of Forming Irregularities

This is a step of forming irregularities on the surface of the wiring or terminals. The method of forming the irregularities may be (1) a method using an acidic solution, (2) a method using an alkaline solution or (3) a method using a treatment solution containing an oxidizing agent or reducing agent. These methods will now be explained.

(1) Method Using an Acidic Solution

As acidic solutions there may be used aqueous solutions containing compounds selected from among compounds such as hydrochloric acid, sulfuric acid, nitric acid, phosphoric acid, acetic acid, formic acid, cupric chloride, ferric sulfate, or alkali metal chlorides, ammonium persulfate and the like, or combinations of these compounds, or aqueous solutions containing acidic hexavalent chromium such as chromic acid, chromic acid-sulfuric acid, chromic acid-hydrofluoric acid, bichromic acid or bichromic acid-fluoroboric acid. The concentrations and treatment times for these solutions are preferably selected as appropriate so that the surface roughness Ra of the copper wiring and copper terminals is 0.01 µm-0.4 µm.

(2) Method Using Alkaline Solution

As alkaline solutions there may be used hydroxide solutions of alkali metals or alkaline earth metals such as sodium hydroxide, potassium hydroxide and sodium carbonate. The concentrations and treatment times for these solutions are preferably selected as appropriate so that the surface roughness Ra of the copper wiring and copper terminals is 0.01 µm-0.4 µm.

(3) Method Using Treatment Solution Containing Oxidizing Agent or Reducing Agent.

As a treatment solution containing an oxidizing agent there may be used an aqueous solution containing an oxidizing agent such as sodium chlorite. It also preferably contains a buffering agent such as an OH anion source or trisodium phosphate. As a treatment solution containing a reducing agent there may be used an aqueous solution obtained by adding a formaldehyde, paraformaldehyde or aromatic aldehyde compound to an alkaline solution adjusted to pH 9.0-13.5, or an aqueous solution containing hypophosphorous acid or a hypophosphorous acid salt. The copper wiring may be immersed in the treatment solution containing the oxidizing agent to form a copper oxide film on the copper surface, and then the copper oxide film reduced by a treatment solution containing a reducing agent, to form fine irregularities on the copper wiring surface. In this case, the treatment using the acidic solution or alkaline solution may be followed by a combination of treatments, with treatment being carried out to a surface roughness Ra of 0.01-0.4 µm.

As pretreatment for the treatment of (1)-(3) mentioned above, it is preferred to carry out degreasing treatment whereby the surface of the wiring and connecting terminals is cleaned using a solvent, an acidic aqueous solution or an aqueous alkali solution. The degreasing treatment is not particularly restricted so long as it can be accomplished using an acidic or alkaline aqueous solution, and preferably the aforementioned acidic aqueous solution or aqueous alkali solution. Sulfuric acid treatment is also preferably carried out by cleaning the wiring surface with a 1-5N sulfuric acid aqueous solution. Degreasing treatment and sulfuric acid cleaning may also be carried out in an appropriate combination.

(B) Step of Forming Metal Coat

After the surface of the copper wiring and copper terminals has been adjusted to a surface roughness Ra of 0.01-0.4 µm by treatment (A) for formation of irregularities, a metal selected from the group consisting of copper, tin, chromium, nickel, zinc, aluminum, cobalt, gold, platinum, silver and palladium, or a metal comprising an alloy containing such metals, may be attached to the surface of the copper wiring and copper terminals in a continuous or discrete manner to a film thickness of 5 nm-0.4 µm, to form wiring and connecting terminals covered with a metal coating with a surface roughness Ra of 0.01-0.4 µm. Preferably, either during or after the metal selected from the group consisting of copper, tin, chromium, nickel, zinc, aluminum and cobalt, or the alloy containing such a metal, is attached to the surface of the copper wiring and copper terminals, it is converted to an oxide, hydroxide or a combination of such compounds either naturally or intentionally, to form a layer comprising an oxide, hydroxide or combination thereof of the polyvalent metal on the surface of the copper wiring and copper terminals. Metals such as molybdenum, titanium, tungsten, lead, iron, indium, thallium, bismuth, ruthenium, rhodium, gallium and germanium may also be used in addition to the metals mentioned above, and an alloy containing two or more of these may also be used. As methods for attaching these metals to wiring and connecting terminal surfaces there may be mentioned electroless plating, electrolytic plating, displacement reaction, spray atomizing, coating, sputtering, vapor deposition and the like.

(C) Step of Forming Si—O—Si Bond

This is step of using a compound that forms an Si—O—Si bond to form an Si—O—Si bond on the surface of the copper wiring and copper terminals. The compound with an Si—O—Si bond may be a compound containing (1) silica glass or (2) a ladder structure.

(1) Silica Glass

The thickness of the silica glass ($SiO_2$) is 0.002 µm-5 µm, preferably 0.005 µm-1 µm and even more preferably 0.01 µm-0.2 µm. If the thickness of the silica glass exceeds 5.0 µm, it will tend to be difficult to accomplish via formation with a laser or the like in the via hole-forming step, and if it is less than 0.002 µm it will tend to be difficult to form a silica glass layer.

(2) Compound Comprising Ladder Structure

A compound comprising a ladder structure is a compound comprising a ladder structure represented by the following general formula (1), wherein $R^1$, $R^2$, $R^3$ and $R^4$ each independently represent a group selected from the group consisting of hydrogen, reactive groups, hydrophilic groups and hydrophobic groups.

As examples of reactive groups there may be mentioned amino, hydroxyl, carboxyl, epoxy, mercapto, thiol, oxazoline, cyclic ester, cyclic ether, isocyanate, acid anhydride, ester, amino, formyl, carbonyl, vinyl, hydroxy-substituted silyl, alkoxy-substituted silyl and halogen-substituted silyl groups. As examples of hydrophilic groups there may be mentioned polysaccharide, polyether, hydroxyl, carboxyl, sulfuric acid, sulfonic acid, phosphate, phosphonium salt, heterocyclic and amino groups, as well as their salts and esters. As examples of hydrophobic groups there may be mentioned compounds selected from among C1-C60 aliphatic hydrocarbons, C6-C60 aromatic hydrocarbons, heterocyclic groups and polysiloxane residues. Of these, $R^2$, $R^3$ and $R^4$ are most preferably reactive groups from the viewpoint of adhesion with the wiring.

[Chemical Formula 1]

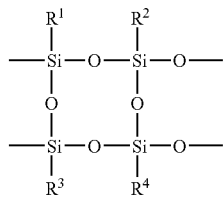

(1)

(D) Step of Coupling Treatment

This is a step in which, after forming the compound with an Si—O—Si bond on the wiring surface, a solution containing a coupling agent is used for treatment. Using a coupling agent can improve the bonding strength between the wiring and terminals and the interlayer insulating layer (build-up layer).

As coupling agents to be used there may be mentioned silane-based coupling agents, aluminum-based coupling agents, titanium-based coupling agents and zirconium-based coupling agents, among which silane-based coupling agents are preferred. As silane-based coupling agents there may be mentioned those having functional groups such as epoxy, amino, mercapto, imidazole, vinyl or methacryl groups in the molecule. These silane-based coupling agents may be used alone or in combinations of two or more.

The solvent used for preparation of the silane-based coupling agent solution may be water, an alcohol, a ketone, or the like. A small amount of an acid such as acetic acid or hydrochloric acid may also be added to promote hydrolysis of the coupling agent.

The coupling agent content is preferably 0.01% by mass-5% by mass and more preferably 0.1% by mass-1.0% by mass with respect to the entire solution. Treatment with the coupling agent may be carried out by a method of immersing the board comprising the wiring and connecting terminal, a method of spray atomizing the board comprising the wiring and connecting terminals, or a method of coating the board comprising the wiring and connecting terminals, using the coupling agent solution prepared as described above.

The board that has been treated with the silane-based coupling agent may be naturally dried, dried by heating, or vacuum dried. Depending on the type of coupling agent used, the drying may be preceded by rinsing or ultrasonic cleaning.

(E) Method of Applying Photocatalyst

This is a step in which, after the compound comprising the Si—O—Si bond is formed on the surface of the copper wiring and copper terminals, it is coated with photocatalytic particles made of a laminar oxide comprising $TiO_2$, ZnO, $SrTiO_3$, CdS, GaP, InP, GaAs, $BaTiO_3$, $BaTi_4O_9$, $K_2NbO_3$, $Nb_2O_5$, $Fe_2O_3$, $Ta_2O_5$, $K_3Ta_3Si_2O_3$, $WO_3$, $SnO_2$, $Bi_2O_3$, $BiVO_4$, NiO, $Cu_2O$, SiC, $MoS_2$, InPb, $RuO_2$, $CeO_2$ or the like, or an element selected from the group consisting of Ti, Nb, Ta and V. Most preferred among these photocatalysts is $TiO_2$ which has harmlessness and excellent chemical stability. The $TiO_2$ may be anatase, rutile or brookite.

The step may be carried out before and/or after treatment with the silane coupling agent in the step of coupling treatment (D). The photocatalytic particles may be used in admixture with a compound comprising a ladder structure represented by general formula (1) above, or a silane coupling agent.

After coating the photocatalytic particles and drying, they may be further subjected to heat treatment and photoirradiation if necessary. Ultraviolet light, visible light, infrared light or the like may be used for the photoirradiation, with ultraviolet light being most preferred.

(F) Step of Treatment Using Adhesive Modifier

This is a step of coating an adhesive modifier on the surface of the copper wiring and copper terminals. The adhesive modifier used may be a thermosetting resin, a thermoplastic resin or a mixture of such resins, but a thermosetting organic insulating material is preferably the main component. As adhesive modifiers there may be used phenol resins, urea resins, melamine resins, alkyd resins, acrylic resins, unsaturated polyester resins, diallyl phthalate resins, epoxy resins, polybenzoimidazole resins, polyamide resins, polyamideimide resins, silicone resins, resins synthesized by cyclopentadiene, tris(2-hydroxyethyl) isocyanurate-containing resins, resins synthesized by aromatic nitrile, trimerized aromatic dicyanamide resins, triallyl trimethacrylate-containing resins, furan resins, ketone resins, xylene resins, fused polycyclic aromatic ring-containing thermosetting resins, benzocyclobutene resins, fluorine resins, polyimide resins, polyphenylene oxide resins, polyphenylene sulfide resins, aramid resins, liquid crystal polymers, and the like.

(G) Step of Treatment Using Corrosion Inhibitor

This is a step of coating a corrosion inhibitor on the surface of the copper wiring and copper terminals. The step may be carried out after step (A) in which the irregularities are formed, or before or after the step of coupling treatment (D). The corrosion inhibitor may be added to the aforementioned acidic solution, alkaline solution or coupling agent solution.

The corrosion inhibitor may be one comprising at least one sulfur-containing organic compound or nitrogen-containing organic compound. As specific corrosion inhibitors there may be mentioned compounds containing sulfur atoms, such as mercapto, sulfide and disulfide groups, or compounds containing one or more N-containing organic compounds that have a —N=, N=N or —$NH_2$ group in the molecule.

As compounds with sulfur atoms such as mercapto, sulfide or disulfide groups there may be mentioned aliphatic thiols (HS—$(CH_2)_n$—R). Here, n represents an integer of 1-23, and R represents a monovalent organic group, hydrogen or a halogen atom.

R is preferably an amino group, amide group, carboxyl group, carbonyl or hydroxyl group, without being limited to these. There may also be mentioned C1-C18 alkyl group, C1-C8 alkoxy group, acyloxy group, haloalkyl group, halogen atom, hydrogen atom, thioalkyl group, thiol group, substituted or unsubstituted phenyl group, biphenyl group, naphthyl group, heterocyclic rings and the like. R may have one and preferably two or more amino groups, amide groups, carboxyl groups or hydroxyl groups, and may also optionally have substituents such as the aforementioned alkyl groups.

It is preferred to use a compound where n in the formula is an integer of 1-23, more preferred to use a compound where n is an integer of 4-15, and most preferred to use a compound where n is an integer of 6-12.

As sulfur-containing organic compounds there may be mentioned thiazole derivatives (thiazole, 2-aminothiazole, 2-aminothiazole-4-carboxylic acid, aminothiophene, benzothiazole, 2-mercaptobenzothiazole, 2-aminobenzothiazole, 2-amino-4-methylbenzothiazole, 2-benzothiazolol, 2,3-dihydroimidazo[2,1-b]benzothiazole-6-amine, 2-(2-aminothiazol-4-yl)-2-hydroxyiminoethyl acetate, 2-methylbenzothiazole, 2-phenylbenzothiazole, 2-amino-4-methylthiazole, etc.), thiadiazole derivatives (1,2,3-thiadiazole, 1,2,4-thiadiazole, 1,2,5-thiadiazole, 1,3,4-thiadiazole, 2-amino-5-ethyl-1,3,4-thiadiazole, 5-amino-1,3,4-thiadiazole-2-thiol, 2,5-mercapto-1,3,4-thiadiazole, 3-methylmercapto-5-mercapto-1,2,4-thiadiazole, 2-amino-1,3,4-thiadiazole, 2-(ethylamino)-1,3,4-thiadiazole, 2-amino-5-ethylthio-1,3,4-thiadiazole, etc.), mercaptobenzoic acid, mercaptonaphthol, mercaptophenol, 4-mercaptobiphenyl, mercaptoacetic acid, mercaptosuccinic acid, 3-mercaptopropionic acid, thiouracil, 3-thiourazole, 2-thiouramil, 4-thiouramil, 2-mercaptoquinoline, thioformic acid, 1-thiocoumarin, thiocoumothiazone, thiocresol, thiosalicylic acid, thiocyanuric acid, thionaphthol, thiotolene, thionaphthene, thionaphthenecarboxylic acid, thionaphthenequinone, thiobarbituric acid, thiohydroquinone, thiophenol, thiophene, thiophthalide, thiophthene, thiortionecarbonic acid, thiolutidone, thiolhistidine, 3-carboxypropyl disulfide, 2-hydroxyethyl disulfide, 2-aminopropionic acid, dithiodiglycolic acid, D-cysteine, di-t-butyl disulfide, thiocyan and thiocyanic acid.

As nitrogen-containing organic compounds that have a —N=, N=N or —NH$_2$ group in the molecule there may be mentioned as preferable triazole derivatives (1H-1,2,3-triazole, 2H-1,2,3-triazole, 1H-1,2,4-triazole, 4H-1,2,4-triazole, benzotriazole, 1-aminobenzotriazole, 3-amino-5-mercapto-1,2,4-triazole, 3-amino-1H-1,2,4-triazole, 3,5-diamino-1,2,4-triazole, 3-oxy-1,2,4-triazole, aminourazole, etc.), tetrazole derivatives (tetrazolyl, tetrazolylhydrazine, 1H-1,2,3,4-tetrazole, 2H-1,2,3,4-tetrazole, 5-amino-1H-tetrazole, 1-ethyl-1,4-dihydroxy-5H-tetrazol-5-one, 5-mercapto-1-methyltetrazole, tetrazolemercaptane, etc.), oxazole derivatives (oxazole, oxazolyl, oxazoline, benzooxazole, 3-amino-5-methylisooxazole, 2-mercaptobenzooxazole, 2-aminooxazoline, 2-aminobenzooxazole, etc.), oxadiazole derivatives (1,2,3-oxadiazole, 1,2,4-oxadiazole, 1,2,5-oxadiazole, 1,3,4-oxadiazole, 1,2,4-oxadiazolone-5, 1,3,4-oxadiazolone-5, etc.), oxatriazole derivatives (1,2,3,4-oxatriazole, 1,2,3,5-oxatriazole, etc.), purine derivatives (purine, 2-amino-6-hydroxy-8-mercaptopurine, 2-amino-6-methylmercaptopurine, 2-mercaptoadenine, mercaptohypoxanthine, mercaptopurine, uric acid, guanine, adenine, xanthine, theophylline, theobromine, caffeine, etc.), imidazole derivatives (imidazole, benzoimidazole, 2-mercaptobenzoimidazole, 4-amino-5-imidazolecarboxylic acid amide, histidine, etc.), indazole derivatives (indazole, 3-indazolone, indazolol, etc.), pyridine derivatives (2-mercaptopyridine, aminopyridine, etc.), pyrimidine derivatives (2-mercaptopyrimidine, 2-aminopyrimidine, 4-aminopyrimidine, 2-amino-4,6-dihydroxypyrimidine, 4-amino-6-hydroxy-2-mercaptopyrimidine, 2-amino-4-hydroxy-6-methylpyrimidine, 4-amino-6-hydroxy-2-methylpyrimidine, 4-amino-6-hydroxypyrazolo[3,4-d]pyrimidine, 4-amino-6-mercaptopyrazolo[3,4-d]pyrimidine, 2-hydroxypyrimidine, 4-mercapto-1H-pyrazolo[3,4-d]pyrimidine, 4-amino-2,6-dihydroxypyrimidine, 2,4-diamino-6-hydroxypyrimidine, 2,4,6-triaminopyrimidine, etc.), thiourea derivatives (thiourea, ethylenethiourea, 2-thiobarbituric acid, etc.), amino acids (glycine, alanine, tryptophan, proline, oxyproline, etc.), 1,3,4-thiooxadiazolone-5, thiocoumazone, 2-thiocoumarin, thiosaccharin, thiohydantoin, thiopyrine, γ-thiopyrine, guanadine, guanazole, guanamine, oxazine, oxadiazine, melamine, 2,4,6-triaminophenol, triaminobenzene, aminoindole, aminoquinoline, aminothiophenol and aminopyrazole.

Water and an organic solvent may be used for preparation of the solution containing the corrosion inhibitor. There are no particular restrictions on the type of organic solvent, but alcohols such as methanol, ethanol, n-propyl alcohol and n-butyl alcohol, ethers such as di-n-propyl ether, di-n-butyl ether and diallyl ether, aliphatic hydrocarbons such as hexane, heptane, octane and nonane, and aromatic hydrocarbons such as benzene, toluene and phenol may be used, and any one or combination of two or more of these solvents may be used.

The concentration of the corrosion inhibitor solution is preferably 0.1 ppm-5000 ppm, more preferably 0.5 ppm-3000 ppm and even more preferably 1 ppm-1000 ppm. A corrosion inhibitor concentration of less than 0.1 ppm will not produce a sufficient migration-inhibiting effect, and it may not be possible to obtain sufficient bonding strength between the wiring and insulating resin. A corrosion inhibitor concentration of greater than 5000 ppm will produce a migration-inhibiting effect, but it may not be possible to obtain sufficient bonding strength between the wiring and insulating resin.

There are no particular restrictions on the time for treatment of the surface of the copper wiring and copper terminals with the solution containing the corrosion inhibitor, and it may be appropriately adjusted according to the type and concentration of the corrosion inhibitor.

(Semiconductor Package)

Figure 7:
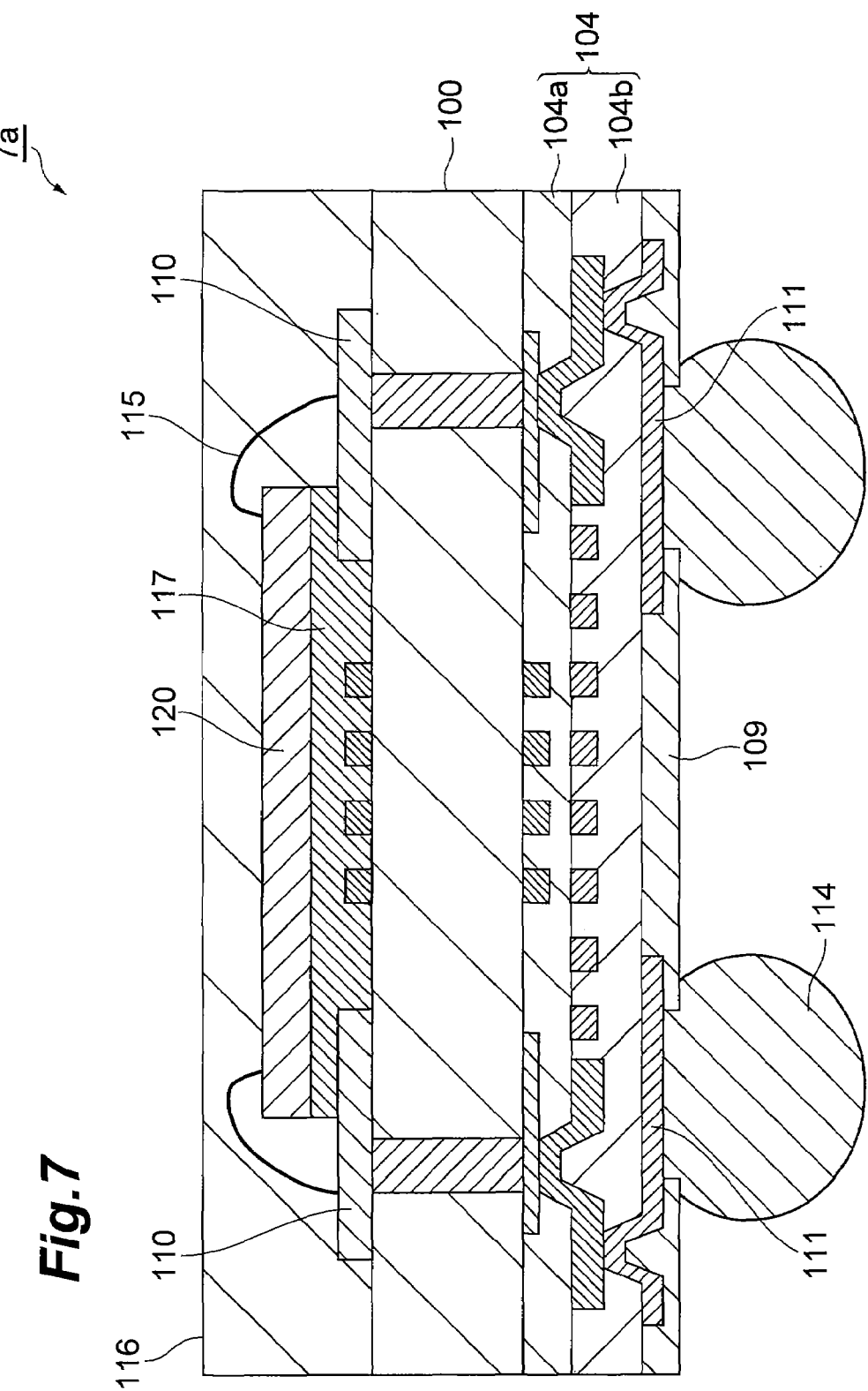
FIG. 7 is a schematic cross-sectional view showing an embodiment of a semiconductor package.

FIG. 7 is a schematic cross-sectional view showing an embodiment of a semiconductor package. The semiconductor package 7a is a wire bond type semiconductor package. The semiconductor package 7a comprises the aforementioned semiconductor chip mounting board 2a and a semiconductor chip 120 mounted on the semiconductor chip mounting board 2a.

The semiconductor chip mounting board 2a and semiconductor chip 120 are bonded by a die bond film 117. Die bond paste may also be used instead of the die bond film 117.

The semiconductor chip 120 and wire bonding connecting terminals 110 are electrically connected together by a wire bond employing gold wire 115. The wire bonding connecting terminal 110 has a plating film comprising an electroless nickel plating film, a first palladium plating film with a purity of 99% by mass or greater, a second palladium plating film with a purity of at least 90% by mass and less than 99% by mass, and a displacement gold plating film, formed on the contact surface with the gold wire in that order from the inside. Connecting terminals with excellent wire bonding connectivity can thus be obtained. If an electroless gold plating film is further laminated over the displacement gold plating film, the wire bonding connection reliability will be further improved.

The semiconductor chip 120 may be sealed with a semiconductor sealing resin 116 using a transfer mold system. The sealing regions may be only at the necessary sections, but preferably the entire semiconductor package region is sealed as shown in FIG. 7. This will facilitate simultaneous cutting of the board and sealing resin with a dicer or the like, for a semiconductor chip mounting board having a plurality of semiconductor package regions arranged in rows and columns.

The solder connecting terminals 111 may have solder balls 114, for example, mounted thereon for electrical connection with a motherboard. The solder balls 114 may be, for example, eutectic solder or lead-free solder as mentioned above.

Each solder connecting terminal 111 has a plating film comprising an electroless nickel plating film, a first palladium plating film with a purity of 99% by mass or greater, a second palladium plating film with a purity of at least 90% by mass and less than 99% by mass, and a displacement gold plating film, or additionally an electroless gold plating film, formed on the contact surface with the solder ball 114 in that order from the inside. Connecting terminals with excellent solder connection reliability can thus be obtained. The apparatus used for connection between the solder connecting terminals 111 and solder balls 114 may be a reflow apparatus employing $N_2$ gas, for example.

The semiconductor package 7a having such connecting terminals has excellent wire bonding properties and solder connection reliability.

Figure 8:
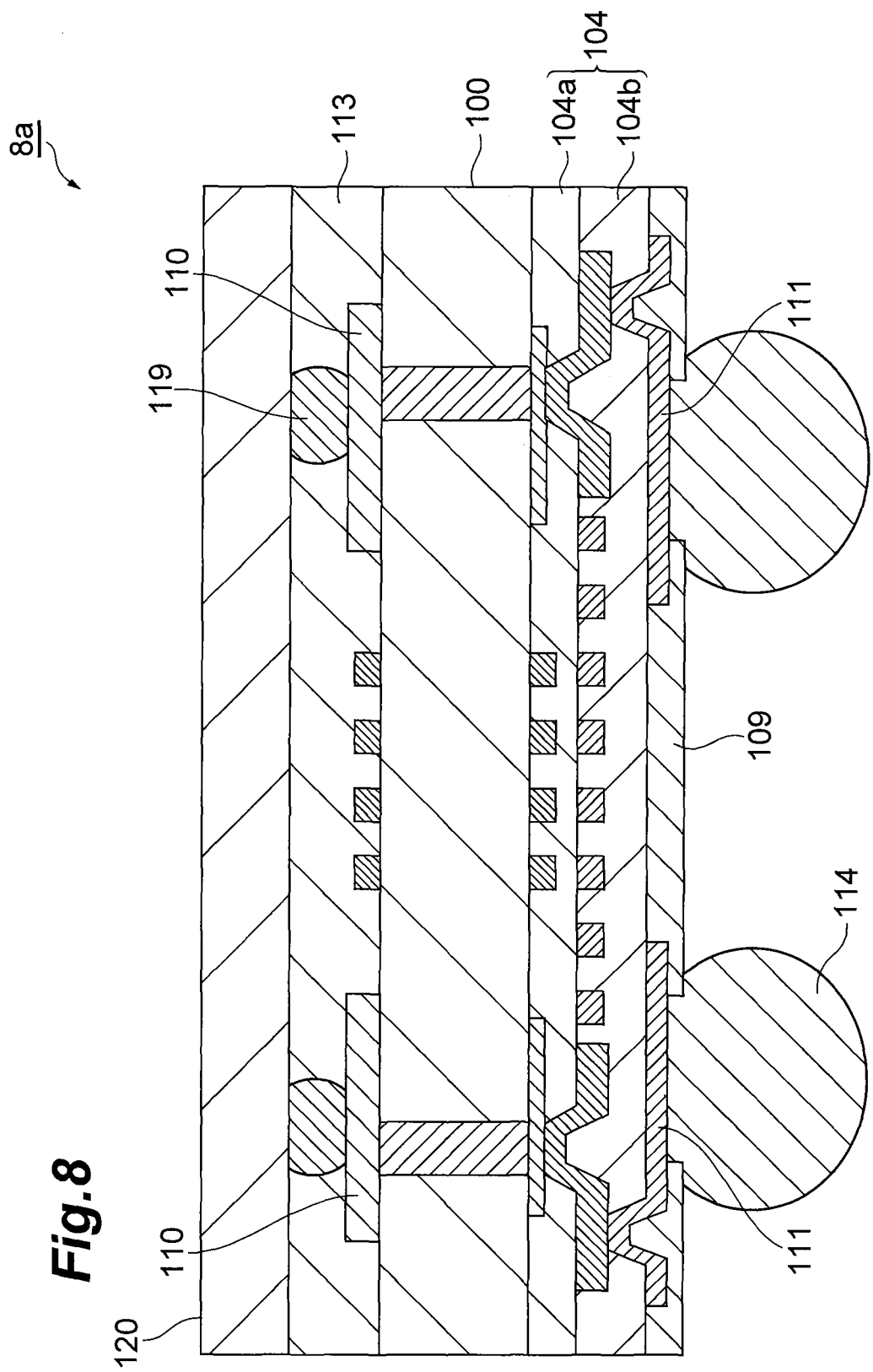
FIG. 8 is a schematic cross-sectional view showing another embodiment of a semiconductor package.

FIG. 8 is a schematic cross-sectional view showing another embodiment of a semiconductor package. The semiconductor package 8a is a flip-chip type semiconductor package. The semiconductor package 8a comprises a semiconductor chip mounting board 2a and a semiconductor chip 120 mounted on the semiconductor chip mounting board 2a.

The semiconductor chip 120 is mounted on the semiconductor chip mounting board 2a via connection bumps 119, and the semiconductor chip 120 and wire bonding connecting terminals 110 are connected by flip-chip connection via the connection bumps 119 to establish electrical connection.

The semiconductor package 8a has an underfill material 113 filling in the space between the semiconductor chip 120 and semiconductor chip mounting board 2a, as shown in FIG. 8. The space between the semiconductor chip 120 and semiconductor chip mounting board 2a is preferably sealed in this manner by the underfill material 113. The thermal expansion coefficient of the underfill material 113 is preferably close to the thermal expansion coefficient of the semiconductor chip 120 and core board 100, but this is not restrictive. More preferably, the thermal expansion coefficient of the underfill material 113 is such that the relationship between the thermal expansion coefficient of the semiconductor chip 120 and the thermal expansion coefficient of the core board 100 satisfies the inequality: (thermal expansion coefficient of semiconductor chip)≦(thermal expansion coefficient of underfill material)≦(thermal expansion coefficient of core board).

Mounting on the semiconductor chip 120 may be accomplished using an anisotropic conductive film (ACF) or an adhesive film containing no conductive particles (NCF). This is more preferred since it will obviate the need for sealing with the underfill material 113. Ultrasonic waves are also preferably used during mounting of the semiconductor chip 120, in order to accomplish electrical connection at low temperature and in a short period of time.

The semiconductor chip 120 and the connecting terminals 110 that are connected by flip-chip connection via the connection bumps 119 correspond to the wire bonding connecting terminals 110 of the aforementioned wire bond type semiconductor package 7a. Each connecting terminal 110 has a plating film comprising an electroless nickel plating film, a first palladium plating film with a purity of 99% by mass or greater, a second palladium plating film with a purity of at least 90% by mass and less than 99% by mass, and a displacement gold plating film, or additionally an electroless gold plating film, formed on the contact surface with the connection bump 119 in that order from the inside. Connecting terminals with excellent connection reliability can thus be obtained.

Each solder connecting terminal 111 has a plating film comprising an electroless nickel plating film, a first palladium plating film with a purity of 99% by mass or greater, a second palladium plating film with a purity of at least 90% by mass and less than 99% by mass, and a displacement gold plating film, or additionally an electroless gold plating film, formed on the contact surface with the solder ball 114 in that order from the inside, similar to the wire bond type semiconductor package 7a described above. Connecting terminals with excellent solder connection reliability can thus be obtained. The apparatus used for connection between the solder connecting terminals 111 and solder balls 114 may be a reflow apparatus employing $N_2$ gas, for example.

The semiconductor package 8a having such connecting terminals has excellent solder connection reliability.

The solder connecting terminals 111 may also have solder balls 114, for example, mounted thereon for electrical connection with a motherboard. Eutectic solder or Pb-free solder is used for the solder balls. The method for anchoring the solder balls to the external connecting terminals will generally be one employing an $N_2$ reflow apparatus, but this is not restrictive.

The semiconductor package 8a may be fabricated by using a dicer or the like to cut a semiconductor chip mounting board having a plurality of semiconductor package regions arranged in rows and columns, into individual semiconductor packages, similar to the fabrication of the semiconductor package 7a described above.

(Configuration of Semiconductor Chip Mounting Board)

FIG. 9(a) is a schematic plan view showing an embodiment of a semiconductor chip mounting board according to the invention. FIG. 9(b) is a magnified view of region A in FIG. 9(a). The configuration of the semiconductor chip mounting board 9a is preferably as a frame as shown in FIG. 9(a), from the viewpoint of efficient assembly of the semiconductor package.

The semiconductor chip mounting board 9a has blocks 23 comprising a plurality of semiconductor package regions 13 (the sections composed of individual semiconductor packages) arranged on a circuit board 22 in lattice-like rows and columns at equal spacings. Only two blocks are shown in FIG. 9(a), but if necessary the number of blocks may be increased and they may be arranged in a lattice-like way to form rows or columns.

The width of the spaces between the semiconductor package regions 13 is preferably 50-500 μm and more preferably 100-300 μm. It is more preferably equal to the blade width of the dicer used to subsequently cut the semiconductor package. The semiconductor chip mounting board 9a can be effectively utilized by arranging the semiconductor package regions 13 in this manner.

A reinforcing pattern 24 is also preferably formed in the spaces between the semiconductor package regions 13 or outside the blocks 23. The reinforcing pattern 24 is preferably a metal pattern formed simultaneously with the wiring that is formed in the semiconductor package regions. The surface of the metal pattern is preferably plated with nickel, gold or the like, or more preferably it is covered with an insulating film. If the reinforcing pattern 24 is such a metal pattern, it can be used as plating leads for electrolytic plating. The reinforcing pattern 24 may also be formed separately and attached to the semiconductor chip mounting board.

Locating marks 11 may be formed at the edges of the semiconductor chip mounting board 9a. The locating marks 11 are preferably pinholes created by through-holes. The shapes and positions of the pinholes may be selected according to the forming method and the semiconductor package assembly apparatus.

Cut positioning marks 25 are also preferably formed on the outside of the blocks 23, for cutting with a dicer.

The semiconductor chip mounting board having a plurality of semiconductor package regions arranged in rows and columns may be cut into individual semiconductor packages using a dicer or the like, as explained above.

The invention was explained in detail above based on preferred embodiments, but the invention is not limited to these embodiments in any way.

EXAMPLES

The present invention will now be explained in more detail based on examples, with the understanding that the invention is not limited to the examples.

Example 1

The following steps were carried out to fabricate a semiconductor chip mounting board having the same construction as the embodiment shown in FIG. 2, according to the manufacturing method embodiment shown in FIG. 6.

(Step a: Formation of First Wiring)

A 0.4 mm-thick soda glass board (thermal expansion coefficient: 11 ppm/° C.) was prepared as the core board 100, and a 200 nm copper thin-film was formed on one side thereof by sputtering (hereinafter this will be referred to as the "first main side"). The sputtering was carried out using a sputtering apparatus (MLH-6315, product of ULVAC Corp.) under the following conditions 1. In addition, a copper plating layer with a film thickness of 10 μm was formed by electrolytic copper plating on the copper thin-film. An etching resist was then formed to cover the sections of the copper plating layer which were to constitute the wiring, and a ferric chloride etching solution was used for etching to form first wiring 106a (including the wire bonding connecting terminals 110).
Conditions 1
Current: 3.5 A
Voltage: 500 V
Argon flow rate: 35 SCCM
Pressure: $5\times10^{-3}$ Torr ($4.9\times10^{-2}$ Pa)
Film-forming speed: 5 nm/sec (Step b: Formation of First Via Holes)

Through-holes for the first interlayer connection IVHs 102, having a diameter of 50 μm, were formed using a laser from the side of the soda glass board opposite the first wiring 106a side (hereinafter referred to as the "second main side"), reaching to the wire bonding connecting terminals 110 (FIG. 6(b)). A LAVIA-UV2000 YAG laser (trade name of Sumitomo Heavy Industries, Ltd.) was used as the laser to form the through-holes under conditions with a frequency of 4 kHz, 50 shots and a mask diameter of 0.4 mm. The formed through-holes were filled with MP-200V conductive paste (trade name of Hitachi Chemical Co., Ltd.) and hardened at 160° C., 30 minutes, to form first interlayer connection IVHs 102 (FIG. 6(b)) electrically connected to the wire bonding connecting terminals 110 (hereinafter referred to as "first via holes 102").

(Step c: Formation of Second Wiring)

A 200 nm-thick copper thin-film, electrically connected to the first wiring 106a and wire bonding connecting terminals 110 through the first via holes 102 formed in step b, was formed on the second main side by sputtering. The sputtering was carried out in the same manner as step a. A plating with a film thickness of 10 μm was also formed by electrolytic copper plating on the copper thin-film. In addition, an etching resist was formed to cover the sections of the copper thin-film which were to constitute the wiring, in the same manner as step a, and a ferric chloride etching solution was used for etching to form second wiring 106b (including the second interlayer connection terminals 103).

(Step d: Formation of Build-Up Layer)

After immersing the second main side with the second wiring 106b for 2 minutes in a Z-200 acidic degreasing solution (trade name of World Metal Co., Ltd.) adjusted to 200 ml/l and at a solution temperature of 50° C., is was immersed for 2 minutes in water at a liquid temperature of 50° C. for hot water washing, and further rinsed in water for 1 minute. Next, the same second main side was immersed for 1 minute in a 100 ml/l sulfuric acid aqueous solution and rinsed in water for 1 minute. Following this pretreatment, the second main side with the second wiring 106b was immersed for 10 minutes in a solution obtained by adding the imidazole-silane coupling agent IS-1000 (trade name of Japan Energy Corp.) to a concentration of 0.5%, to an aqueous solution adjusted to pH 5 with acetic acid. After then rinsing in water for 1 minute, it was dried at ordinary temperature. Next, the second main side was coated to a thickness of 10 μm with an insulating varnish having a cyanate ester-based resin composition, by spin coating at 1500 rpm. The coated insulating varnish was heated to 230° C. from ordinary temperature at a temperature-elevating rate of 6° C./min, and then held at 230° C. for 1 hour for thermosetting of the cyanate-based resin composition to form a build-up layer 104a.

(Step e: Formation of Through-Holes for Second Via Holes)

Through-holes 108a for the second interlayer connection IVHs 108b were formed with diameters of 50 μm using a laser from the side of the build-up layer 104a opposite the soda glass board 100, reaching to the second interlayer connection terminals 103, to obtain a structure 6e as shown in FIG. 6(e). A LAVIA-UV2000 YAG laser (trade name of Sumitomo Heavy Industries, Ltd.) was used as the laser to form the through-holes 108a under conditions with a frequency of 4 kHz, 20 shots and a mask diameter of 0.4 mm.

(Step f: Formation of Third Wiring)

A nickel layer with a film thickness of 20 nm and a thin-film copper layer with a film thickness of 200 nm were formed by sputtering in that order on the side of the build-up layer 104a of the structure 6e opposite the soda glass board 100, to obtain a seed layer composed of a nickel layer and thin-film copper layer. The sputtering was carried out using the same apparatus as in step a, under the following conditions 2.
Conditions 2
(Formation of Nickel Layer)
Current: 5.0 A
Voltage: 350 V
Argon flow rate: 35 SCCM
Pressure: $5\times10^{-3}$ Torr ($4.9\times10^{-2}$ Pa)
Film-forming speed: 0.3 nm/sec
(Formation of Thin-Film Copper Layer)
Current: 3.5 A
Voltage: 500 V
Argon flow rate: 35 SCCM
Pressure: $5\times10^{-3}$ Torr ($4.9\times10^{-2}$ Pa)
Film-forming speed: 5 nm/sec Next, a PMER P-LA900PM plating resist (trade name of Tokyo Ohka Kogyo Co., Ltd.) was coated onto the seed layer by spin coating to form a plating resist layer with a film thickness of 20 μm. The plating resist layer was exposed at an exposure amount of 1000 mJ/cm², and the structure 6e comprising the seed layer and resist layer was immersed for 6 minutes in P-7G PMER developing solution at a liquid temperature of 23° C. After immersion, it was agitated to form an L/S=10 μm/10 μm resist pattern on the seed layer. The structure 6e on which the resist pattern has been formed was transferred to a copper sulfate plating solution, and a patterned copper plating with a film thickness of approximately 5 μm was formed on the seed layer at the sections without the resist pattern. Next, the structure 6e having the resist pattern and patterned copper plating was immersed for 1 minute in methyl ethyl ketone at room temperature (25° C.) to remove the plating resist. The structure 6e with the patterned copper plating was then immersed for 30 seconds in a 5-fold diluted aqueous solution of CPE-700 (trade name of Mitsubishi Gas & Chemical Co., Inc.) at 30° C. while agitating to remove the seed layer at the sections not covered by the patterned copper plating, thus forming second interlayer connection IVHs 108b (hereinafter referred to as "second via holes 108") and a third wiring 106c. The structure 6f shown in FIG. 6(f) was thus obtained.

(Step g: Fabrication of Semiconductor Chip Mounting Board)

The same procedures of step d to step f were repeated to additionally form outermost layer wiring comprising a build-up layer 104b covering the second via holes 108b and third wiring 106c, and solder connecting terminals 111, and finally a solder resist 109 was formed to produce a semiconductor chip mounting board for a fan-in type BGA as shown in FIG. 1(a) (schematic plan view of semiconductor chip mounting board of one semiconductor package), FIG. 7 (schematic cross-sectional view of one semiconductor package) and FIG. 9 (schematic plan view of semiconductor chip mounting board having a plurality of semiconductor package regions arranged in rows and columns).

(Step h: Plating Pretreatment)

The semiconductor chip mounting board 6g shown in FIG. 6(g) obtained from step a to step g (hereinafter referred to as "structure 6g") was immersed for 3 minutes in a Z-200 degreasing solution (trade name of World Metal Co., Ltd.) at 50° C., and rinsed in water for 2 minutes. Next, the structure 6g was immersed for 1 minute in a 100 g/l ammonium persulfate solution and rinsed in water for 2 minutes. The structure 6g was then immersed for 1 minute in 10% sulfuric acid and rinsed in water for 2 minutes. Next, the structure 6g was immersed for 5 minutes in SA-100 (trade name of Hitachi Chemical Co., Ltd.) as a plating-active treatment solution at a liquid temperature of 25° C., and rinsed in water for 2 minutes.

(Step i: Formation of Electroless Nickel Plating Film)

The structure 6g that had passed through step h was immersed for 25 minutes in NIPS-100 (trade name of Hitachi Chemical Co., Ltd.) as an electroless nickel plating solution at a liquid temperature of 85° C., and rinsed in water for 1 minute.

(Step j: Formation of Displacement Palladium Plating Film or Electroless Palladium Plating Film Comprising at Least 99% by Mass Palladium)

A structure 6g comprising connecting terminals and wiring with a nickel plating film was immersed for 7 seconds in an electroless palladium plating solution (a) (see Table 2) at 65° C. for formation of an electroless palladium plating film comprising at least 99% by mass palladium (hereinafter referred to as "structure 6g-j"), and rinsed in water for 1 minute. The palladium content (purity) of the electroless palladium plating film at this time was essentially 100% by mass as shown in Table 2, and the film thickness was 0.01 μm.

(Step k: Formation of Electroless Palladium Plating Film Comprising at Least 90% by Mass and Less than 99% by Mass Palladium)

Next, the structure 6g comprising the connecting terminals and wiring having a nickel plating film and an electroless palladium plating film comprising at least 99% by mass palladium in that order (hereinafter referred to as "structure 6g-k") was immersed for 5 minutes in an electroless palladium plating solution (b) (see Table 2) at 50° C. for formation of an electroless palladium plating film comprising at least 90% by mass and less than 99% by mass palladium, and then rinsed in water for 1 minute. The palladium content of the electroless palladium plating film at this time was about 95.5% by mass as shown in Table 2 (palladium: 95.5% by mass, phosphorus: 4.5% by mass), and the film thickness was 0.06 μm.

(Step l: Formation of Displacement Gold Plating Film)

Next, the structure 6g comprising the connecting terminals and wiring having a nickel plating film, an electroless palladium plating film comprising at least 99% by mass palladium and an electroless palladium plating film comprising at least 90% by mass and less than 99% by mass palladium in that order (hereinafter referred to as "structure 6g-l") was immersed for 10 minutes in an HGS-100 displacement gold plating solution (trade name of Hitachi Chemical Co., Ltd.) at 85° C., and then rinsed in water for 1 minute.

(Step m: Formation of Electroless Gold Plating Film)

Next, the structure 6g comprising terminals and wiring having a nickel plating film, an electroless palladium plating film comprising at least 99% by mass palladium, an electroless palladium plating film comprising at least 90% by mass and less than 99% by mass palladium, and a displacement gold plating film in that order (hereinafter referred to as "structure 6g-m") was immersed for 30 minutes in an HGS-2000 electroless gold plating solution (trade name of Hitachi Chemical Co., Ltd.) at 70° C., and then rinsed in water for 5 minutes. The total film thickness of the displacement gold plating and electroless gold plating film at this time was 0.3 μm.

<Solder Connection Reliability>

The semiconductor chip mounting board obtained from step a to step m was evaluated for the connection reliability of the connecting terminals, based on the following criteria. The results are shown in Table 1.

Using φ0.76 mm Sn-3.0Ag-0.5Cu solder balls for the first semiconductor chip mounting board with opening diameters of 600 μm, φ0.45 mm Sn-3.0Ag-0.5Cu solder balls for the second semiconductor chip mounting board with opening diameters of 300 μm and φ0.15 mm Sn-3.0Ag-0.5Cu solder balls for the third semiconductor chip mounting board with opening diameters of 100 μm, these were connected to 1000 solder connecting terminals on each of the first to third semiconductor chip mounting boards with a reflow furnace (peak temperature: 252° C.), and a 4000HS Impact Resistance High Speed Bond Tester (trade name of Dage, Ltd.) was used for a solder ball shear test under conditions of approximately 200 mm/sec. First to third semiconductor chip mounting boards were also simultaneously fabricated by connection of solder balls by reflow in the same manner as the aforementioned solder balls and allowed to stand at 150° C. for 1000 hours, and a 4000HS Impact Resistance High Speed Bond Tester (trade name of Dage, Ltd.) was used for a solder ball shear test under conditions of approximately 200 mm/sec. The evaluation criteria were as shown below, and the solder connection reliability was evaluated for each terminal based on these criteria. The results are shown in Table 1.
A: Damage due to shear in the solder balls of the solder connecting terminals at all 1000 locations were observed.
B: Damage other than damage due to shear in the solder balls at 1-10 locations were observed.
C: Damage other than damage due to shear in the solder balls at 11-50 locations were observed.
D: Damage other than damage due to shear in the solder balls at 51 or more locations were observed.

<Wire Bonding Connection Reliability>

The fabricated semiconductor chip mounting board was heat treated at 150° C. for 50 hours for wire bonding. Wire bonding was performed at 1000 locations using 1000 gold wires with wire diameters of 28 μm. The evaluation criteria were as shown below, and the wire bonding connection reliability was evaluated for each terminal based on these criteria. The results are shown in Table 1.
A: Wire bonding successfully performed for wire bonding connecting terminals at 1000 locations.
B: 1-5 locations with poor wire attachment were observed.
C: 6-50 locations with poor wire attachment were observed.
D: 51 or more locations with poor wire attachment were observed.

The film thickness of the electroless palladium plating film was measured using an SFT9500 Fluorescent X-ray Film Thickness Meter (trade name of SII NanoTechnology Inc.). The results are shown in Table 1. The palladium and phosphorus contents of the electroless palladium plating film were measured using an EMAX ENERGY EX-300 Energy Dispersive X-ray analysis apparatus (trade name of Horiba, Ltd.). The results are shown in Table 2.

TABLE 1

| | | Step j 1st palladium plating | | | Step k 2nd palladium plating | | | |
|---|---|---|---|---|---|---|---|---|
| | | Plating solution | Immersion time | Plating film thickness (μm) | Plating solution | Immersion time | Plating film thickness (μm) | P content of Plating film (% by mass) |
| Examples | 1 | (a) | 7 sec | 0.01 | (b) | 5 min | 0.06 | 4.5 |
| | 2 | (a) | 7 sec | 0.01 | (b) | 5 min | 0.06 | 4.5 |
| | 3 | (a) | 30 sec | 0.05 | (b) | 5 min | 0.06 | 4.5 |
| | 4 | (a) | 2 min | 0.2 | (b) | 5 min | 0.06 | 4.5 |
| | 5 | (a) | 7 sec | 0.01 | (b) | 8 min 20 sec | 0.1 | 4.5 |
| | 6 | (a) | 30 sec | 0.05 | (b) | 8 min 20 sec | 0.1 | 4.5 |
| | 7 | (a) | 2 min | 0.2 | (b) | 8 min 20 sec | 0.1 | 4.5 |
| | 8 | (a) | 7 sec | 0.01 | (b) | 12 min 30 sec | 0.15 | 4.5 |
| | 9 | (a) | 7 sec | 0.01 | (c) | 3 min | 0.06 | 3.0 |
| | 10 | (a) | 30 sec | 0.05 | (c) | 3 min | 0.06 | 3.0 |
| | 11 | (a) | 2 min | 0.2 | (c) | 3 min | 0.06 | 3.0 |
| | 12 | (a) | 7 sec | 0.01 | (c) | 5 min | 0.1 | 3.0 |
| | 13 | (a) | 30 sec | 0.05 | (c) | 5 min | 0.1 | 3.0 |
| | 14 | (a) | 2 min | 0.2 | (c) | 5 min | 0.1 | 3.0 |
| | 15 | (a) | 7 sec | 0.01 | (c) | 7 min | 0.15 | 3.0 |
| | 16 | (a) | 7 sec | 0.01 | (d) | 3 min | 0.06 | 6.0 |
| | 17 | (a) | 30 sec | 0.05 | (d) | 3 min | 0.06 | 6.0 |
| | 18 | (a) | 2 min | 0.2 | (d) | 3 min | 0.06 | 6.0 |
| | 19 | (a) | 7 sec | 0.01 | (d) | 5 min | 0.1 | 6.0 |
| | 20 | (a) | 30 sec | 0.05 | (d) | 5 min | 0.1 | 6.0 |
| | 21 | (a) | 2 min | 0.2 | (d) | 5 min | 0.1 | 6.0 |
| | 22 | (a) | 7 sec | 0.01 | (d) | 7 min | 0.15 | 6.0 |
| | 23 | (e) | 2 min | 0.001 | (b) | 5 min | 0.06 | 4.5 |
| | 24 | (e) | 2 min | 0.001 | (b) | 8 min 20 sec | 0.1 | 4.5 |
| | 25 | (e) | 2 min | 0.001 | (b) | 12 min 30 sec | 0.15 | 4.5 |
| Comp. Exs. | 1 | | — | | (b) | 5 min | 0.06 | 4.5 |
| | 2 | | — | | (b) | 8 min 20 sec | 0.1 | 4.5 |
| | 3 | | — | | (b) | 12 min 30 sec | 0.15 | 4.5 |
| | 4 | | — | | (c) | 3 min | 0.06 | 3.0 |
| | 5 | | — | | (c) | 5 min | 0.1 | 3.0 |
| | 6 | | — | | (c) | 7 min | 0.15 | 3.0 |
| | 7 | | — | | (d) | 3 min | 0.06 | 6.0 |
| | 8 | | — | | (d) | 5 min | 0.1 | 6.0 |
| | 9 | | — | | (d) | 7 min | 0.15 | 6.0 |
| | 10 | (a) | 7 sec | 0.01 | | — | | |
| | 11 | (a) | 30 sec | 0.05 | | — | | |
| | 12 | (a) | 2 min | 0.2 | | — | | |

TABLE 1-continued

|  |  | Step m Electroless gold plating | Evaluation | | | | | | Wire bonding connection reliability |
|---|---|---|---|---|---|---|---|---|---|
|  |  |  | solder connection reliability | | | | | | |
|  |  |  | 1st board Let stand at high-temperature | | 2nd board Let stand at high-temperature | | 3rd board Let stand at high-temperature | | |
|  |  |  | Pre | Post | Pre | Post | Pre | Post | |
| Examples | 1 | Yes | A | A | A | A | A | A | A |
|  | 2 | No | A | A | A | A | A | A | B |
|  | 3 | Yes | A | A | A | A | A | A | A |
|  | 4 | Yes | A | A | A | A | A | A | A |
|  | 5 | Yes | A | A | A | A | A | A | A |
|  | 6 | Yes | A | A | A | A | A | A | A |
|  | 7 | Yes | A | A | A | A | A | A | A |
|  | 8 | Yes | A | A | A | A | A | A | A |
|  | 9 | Yes | A | A | A | A | A | A | A |
|  | 10 | Yes | A | A | A | A | A | A | A |
|  | 11 | Yes | A | A | A | A | A | A | A |
|  | 12 | Yes | A | A | A | A | A | A | A |
|  | 13 | Yes | A | A | A | A | A | A | A |
|  | 14 | Yes | A | A | A | A | A | A | A |
|  | 15 | Yes | A | A | A | A | A | A | A |
|  | 16 | Yes | A | A | A | A | A | A | A |
|  | 17 | Yes | A | A | A | A | A | A | A |
|  | 18 | Yes | A | A | A | A | A | A | A |
|  | 19 | Yes | A | A | A | A | A | A | A |
|  | 20 | Yes | A | A | A | A | A | A | A |
|  | 21 | Yes | A | A | A | A | A | A | A |
|  | 22 | Yes | A | A | A | A | A | A | A |
|  | 23 | Yes | A | A | A | A | A | A | A |
|  | 24 | Yes | A | A | A | A | A | A | A |
|  | 25 | Yes | A | A | A | A | A | A | A |
| Comp. Exs. | 1 | Yes | C | D | C | D | D | D | D |
|  | 2 | Yes | B | C | B | C | C | D | C |
|  | 3 | Yes | B | B | B | B | C | C | B |
|  | 4 | Yes | C | D | C | D | D | D | D |
|  | 5 | Yes | B | C | B | C | C | C | C |
|  | 6 | Yes | B | B | B | B | C | D | B |
|  | 7 | Yes | C | D | C | D | D | D | C |
|  | 8 | Yes | B | B | B | B | C | D | B |
|  | 9 | Yes | B | B | B | B | C | C | B |
|  | 10 | Yes | A | B | A | B | A | B | B |
|  | 11 | Yes | A | B | A | B | A | B | A |
|  | 12 | Yes | A | B | A | B | A | B | A |

The palladium plating solutions used in step j and step k are shown in Table 2.

TABLE 2

| No | Plating solution | Pd purity |
|---|---|---|
| (a) | PALETTE (trade name, Kojima Chemicals Co., Ltd.) | ~100% by mass |
| (b) | TPD-30 (trade name, Uemura & Co., Ltd.) | ~95.5% by mass (Pd: 95.5% by mass, P: 4.5% by mass) |
| (c) | Palladium chloride: 0.01 mol/l Ethylenediamine: 0.08 mol/l Sodium hypophosphite: 0.03 mol/l Thiodiglycolic acid: 10 ppm pH: 8 | ~97% by mass (Pd: 97% by mass, P: 3% by mass) |
| (d) | Palladium chloride: 0.01 mol/l Ethylenediamine: 0.08 mol/l Sodium hypophosphite: 0.12 mol/l Thiodiglycolic acid: 10 ppm pH: 8 | ~94% by mass (Pd: 94% by mass, P: 6% by mass) |
| (e) | MCA (trade name, World Metal Co., Ltd.) | ~100% by mass |

Example 2

Each step was carried out in the same manner as Example 1, except that step m of Example 1 was omitted. The results are shown in Table 1.

Examples 3-8

The immersion treatment time for structure 6g-j and/or structure 6g-k in step j and/or step k of Example 1 was changed as shown in Table 1, to form electroless palladium plating films with different film thicknesses on the connecting terminals and wiring of structure 6g-j and the connecting terminals and wiring of wiring structure 6g-k. The other steps were carried out in the same manner as Example 1. The results are shown in Table 1.

Example 9

Each step was carried out in the same manner as Example 1, except that the plating solution was changed from (b) to (c) as shown in Table 2 for step k of Example 1, and the immersion times were changed as shown in Table 1. The results are shown in Table 1.

Examples 10-15

The immersion treatment time for structure 6g-j and/or structure 6g-k in step j and/or step k of Example 9 was changed as shown in Table 1, to form electroless palladium plating films with different film thicknesses on the connecting terminals and wiring of structure 6g-j and the connecting terminals and wiring of wiring structure 6g-k. The other steps were carried out in the same manner as Example 9. The results are shown in Table 1.

Example 16

Each step was carried out in the same manner as Example 1, except that the plating solution was changed from (b) to (d) as shown in Table 2 for step k of Example 1, and the immersion times were changed as shown in Table 1. The results are shown in Table 1.

Examples 17-22

The immersion treatment time for structure 6g-j and/or structure 6g-k in step j and/or step k of Example 16 was changed as shown in Table 1, to form electroless palladium plating films with different film thicknesses on the connecting terminals and wiring of structure 6g-j and the connecting terminals and wiring of wiring structure 6g-k. The other steps were carried out in the same manner as Example 16. The results are shown in Table 1.

Example 23

Each step was carried out in the same manner as Example 1, except that the plating solution was changed from (a) to (e) as shown in Table 2 for step j of Example 1, the plating solution was changed from (b) to (d) as shown in Table 2 for step k, and the immersion times were changed as shown in Table 1. The results are shown in Table 1.

Examples 24 and 25

The immersion treatment time for structure 6g-k was changed as shown in Table 1 for step k of Example 23, to form electroless palladium plating films with different film thicknesses on the connecting terminals and wiring of structure 6g-k. The other steps were carried out in the same manner as Example 23. The results are shown in Table 1.

Comparative Example 1

Each step was carried out in the same manner as Example 1, except that step j of Example 1 was omitted. The results are shown in Table 1.

Comparative Example 2

Each step was carried out in the same manner as Example 5, except that step j of Example 5 was omitted. The results are shown in Table 1.

Comparative Example 3

Each step was carried out in the same manner as Example 8, except that step j of Example 8 was omitted. The results are shown in Table 1.

Comparative Example 4

Each step was carried out in the same manner as Example 9, except that step j of Example 9 was omitted. The results are shown in Table 1.

Comparative Example 5

Each step was carried out in the same manner as Example 12, except that step j of Example 12 was omitted. The results are shown in Table 1.

Comparative Example 6

Each step was carried out in the same manner as Example 15, except that step j of Example 15 was omitted. The results are shown in Table 1.

Comparative Example 7

Each step was carried out in the same manner as Example 16, except that step j of Example 16 was omitted. The results are shown in Table 1.

Comparative Example 8

Each step was carried out in the same manner as Example 19, except that step j of Example 19 was omitted. The results are shown in Table 1.

Comparative Example 9

Each step was carried out in the same manner as Example 22, except that step j of Example 22 was omitted. The results are shown in Table 1.

Comparative Example 10

Each step was carried out in the same manner as Example 1, except that step k of Example 1 was omitted. The results are shown in Table 1.

Comparative Example 11

Each step was carried out in the same manner as Example 3, except that step k of Example 3 was omitted. The results are shown in Table 1.

Comparative Example 12

Each step was carried out in the same manner as Example 4, except that step k of Example 4 was omitted. The results are shown in Table 1.

The invention claimed is:
1. A connecting terminal comprising:
(a) a conductive layer;
(b) an electroless nickel plating film;
(c) a first palladium plating film that is a displacement or electroless palladium plating film with a purity of 99% by mass or greater;
(d) a second palladium plating film that is an electroless palladium plating film with a purity of at least 90% by mass and less than 99% by mass; and
(e) a displacement gold plating film,
wherein the electroless nickel plating film, the first palladium plating film, the second palladium plating film and the displacement gold plating film are laminated in that order on one side of the conductive layer, and the displacement gold plating film is situated on an uppermost surface layer on an opposite side of the conductive layer.

2. A connecting terminal according to claim 1, wherein the film thickness of the displacement gold plating film is at least 0.005 μm.

3. A connecting terminal according to claim 1, which further comprises an electroless gold plating film laminated on the displacement gold plating film, wherein the electroless gold plating film is situated on the uppermost surface layer on the side opposite the conductive layer.

4. A connecting terminal according to claim 3, wherein the total of the film thicknesses of the displacement gold plating film and electroless gold plating film is at least 0.005 μm.

5. A connecting terminal according to claim 1, wherein the connecting terminal is a wire bonding connecting terminal.

6. A connecting terminal according to claim 1, wherein the connecting terminal is a solder connecting terminal.

7. A connecting terminal according to claim 1, wherein the second palladium plating film is a palladium-phosphorus plating film.

8. A connecting terminal according to claim 1, wherein the film thickness of the first palladium plating film is not greater than 0.4 μm.

9. A connecting terminal according to claim 1, wherein the film thickness of the second palladium plating film is 0.03 to 0.3 μm.

10. A connecting terminal according to claim 1, wherein the purity of the electroless nickel plating film is at least 80% by mass.

11. A connecting terminal according to claim 1, wherein the film thickness of the electroless nickel plating film is 0.1 to 20 μm.

12. A connecting terminal according to claim 1, wherein the conductive layer contains at least one metal selected from the group consisting of copper, tungsten, molybdenum and aluminum.

13. A semiconductor package comprising:
   a board;
   wiring formed on the board;
   connecting terminals that are connecting terminals according to claim 1 with a portion of the wiring as the conductive layer; and
   a semiconductor chip mounted on the board in a manner electrically connected with the connecting terminals.

14. A method for manufacturing a semiconductor package, wherein the method comprises the steps of:
   (a) forming, in the following order, an electroless nickel plating film, a first palladium plating film that is a displacement or electroless palladium plating film with a purity of 99% by mass or greater, a second palladium plating film that is an electroless palladium plating film with a purity of at least 90% by mass and less than 99% by mass, and a displacement gold plating film, on a surface of part of a conductive layer formed on a board to form connecting terminals that comprise parts of the conductive layer, the first palladium plating film, the second palladium plating film and the displacement gold plating film; and
   (b) mounting a semiconductor chip on the board in a manner electrically connected to the connecting terminals.

15. A method for manufacturing a semiconductor package, wherein the method comprises the steps of:
   (a) forming, in the following order, an electroless nickel plating film, a first palladium plating film that is a displacement or electroless palladium plating film with a purity of 99% by mass or greater, a second palladium plating film that is an electroless palladium plating film with a purity of at least 90% by mass and less than 99% by mass, a displacement gold plating film and an electroless gold plating film, on a surface of part of a conductive layer formed on a board to form connecting terminals that comprise parts of the conductive layer, the first palladium plating film, the second palladium plating film, the displacement gold plating film and the electroless gold plating film; and
   (b) mounting a semiconductor chip on the board in a manner electrically connected to the connecting terminals.

16. A connecting terminal comprising:
   (a) a conductive layer;
   (b) an electroless nickel plating film;
   (c) a first palladium plating film that is a displacement or electroless palladium plating film with a purity of 99% by mass or greater;
   (d) a second palladium plating film that is an electroless palladium plating film with a purity of at least 90% by mass and less than 99% by mass; and
   (e) a displacement gold plating film,
   wherein the electroless nickel plating film, the first palladium plating film, the second palladium plating film and the displacement gold plating film are laminated in that order on one side of the conductive layer, and the displacement gold plating film is situated on an uppermost surface layer on an opposite side of the conductive layer, and
   wherein the sum of the film thicknesses of the first palladium plating film and the second palladium plating film is 0.03 μm to 0.5 μm.

* * * * *